(12) United States Patent
Tokura et al.

(10) Patent No.: US 7,692,214 B2
(45) Date of Patent: Apr. 6, 2010

(54) SEMICONDUCTOR DEVICE HAVING IGBT CELL AND DIODE CELL AND METHOD FOR DESIGNING THE SAME

(75) Inventors: Norihito Tokura, Okazaki (JP); Yukio Tsuzuki, Nukata-gun (JP); Kenji Kouno, Gifu (JP)

(73) Assignee: DENSO CORPORATION, Kariya (JP)

( * ) Notice: Subject to any disclaimer, the term of this patent is extended or adjusted under 35 U.S.C. 154(b) by 100 days.

(21) Appl. No.: 11/885,334

(22) PCT Filed: Mar. 20, 2007

(86) PCT No.: PCT/JP2007/055600

§ 371 (c)(1),
(2), (4) Date: Aug. 30, 2007

(87) PCT Pub. No.: WO2007/108456

PCT Pub. Date: Sep. 27, 2007

(65) Prior Publication Data

US 2008/0315248 A1 Dec. 25, 2008

(30) Foreign Application Priority Data

Mar. 22, 2006 (JP) ............................. 2006-079153
Mar. 9, 2007 (JP) ............................. 2007-060809

(51) Int. Cl.
*H01L 29/00* (2006.01)

(52) U.S. Cl. .................. 257/197; 257/205; 257/273; 257/517; 257/E27.015

(58) Field of Classification Search ................ 257/139, 257/46, 47, 351, 477, 511, 197, 205, 273, 257/517, E27.015
See application file for complete search history.

(56) References Cited

U.S. PATENT DOCUMENTS

| 7,112,868 | B2 | 9/2006 | Willmeroth et al. |
| 2004/0144992 | A1* | 7/2004 | Willmeroth et al. .......... 257/107 |
| 2005/0017290 | A1 | 1/2005 | Takahashi et al. |

FOREIGN PATENT DOCUMENTS

JP    A-5-3205    1/1993

(Continued)

OTHER PUBLICATIONS

T. Laska, et al., "The Field Stop IGBT (FS IGBT)—A New Power Device Concept with a Great Improvement Potential," ISPSD 2000, May 2000, Toulouse, France.

(Continued)

*Primary Examiner*—Tan N Tran
(74) *Attorney, Agent, or Firm*—Posz Law Group, PLC

(57) ABSTRACT

A semiconductor device includes: a semiconductor substrate; an IGBT cell; and a diode cell. The substrate includes a first layer on a first surface, second and third layers adjacently arranged on a second surface of the substrate and a fourth layer between the first layer and the second and third layers. The first layer provides a drift layer of the IGBT cell and the diode cell. The second layer provides a collector layer of the IGBT cell. The third layer provides one electrode connection layer of the diode cell. A resistivity $\rho_1$ and a thickness $L_1$ of the first layer, a resistivity $\rho_2$ and a thickness $L_2$ of the fourth layer, and a half of a minimum width W2 of the second layer on a substrate plane have a relationship of $(\rho_1/\rho_2) \times (L_1 \cdot L_2 / W_2^2) < 1.6$.

15 Claims, 13 Drawing Sheets

FOREIGN PATENT DOCUMENTS

| | | |
|---|---|---|
| JP | A-6-196705 | 7/1994 |
| JP | A-2004-103982 | 4/2004 |
| JP | A-2004-363328 | 12/2004 |

OTHER PUBLICATIONS

Office Action dated Mar. 18, 2009 issued from the German Patent Office for counterpart application No. 11 2007 000 010.4-33 (English translation enclosed).

International Search Report and Written Opinion of the International Searching Authority mailed on Jun. 19, 2007 for corresponding International patent application No. PCT/JP2007/055600 (English translation enclosed).

Takahashi et al., "1200V Reverse Conducting IGBT" Mitsubishi Electric Corporation, Power Device Works, ISPSD 2004.

Office Action dated Oct. 26, 2009 issued from the Chinese Patent Office for counterpart application No. 2007800004744 (English translation enclosed).

* cited by examiner

| WITHSTAND VOLTAGE | $\rho_1$ | $\rho_2$ | $L_1$ | $L_2$ |
|---|---|---|---|---|
| 600V | $>20\,\Omega\,cm$ | $<1.0\,\Omega\,cm$ | $>40\,\mu m$ | $>0.5\,\mu m$ |
| 1200V | $>40\,\Omega\,cm$ | $<1.0\,\Omega\,cm$ | $>80\,\mu m$ | $>0.5\,\mu m$ |

| $\rho_2$ [Ωcm] | $W_2$ [μm] | k |
|---|---|---|
| 0.50 | 100 | 1.40 |
| 0.27 | 135 | 1.43 |
| 0.20 | 160 | 1.37 |
| 0.15 | 175 | 1.53 |

| $\rho_2$ [Ωcm] | $W_2$ [μm] | k |
|---|---|---|
| 0.50 | 200 | 0.351 |
| 0.27 | 260 | 0.385 |
| 0.20 | 300 | 0.390 |
| 0.15 | 350 | 0.382 |

SEMICONDUCTOR DEVICE HAVING IGBT CELL AND DIODE CELL AND METHOD FOR DESIGNING THE SAME

CROSS REFERENCE TO RELATED APPLICATIONS

This application is based on Japanese Patent Applications No. 2006-79153 filed on Mar. 22, 2006, and No. 2007-060809 filed on Mar. 9, 2007, the disclosures of which are incorporated herein by reference.

TECHNICAL FIELD

The present invention relates to a semiconductor device having an IGBT cell and a diode cell, and a method for designing the same.

BACKGROUND ART

Inverter circuits for driving loads such as motors correspond to DC/AC converters which convert DC voltages to AC voltages so as to supply the converted AC voltages to the motors, namely the loads. Inverter circuits for driving inductive motors are arranged by, for instance, insulated gate bipolar transistors (IGBTs) corresponding to switching elements, and free wheel diodes (FWDs). In one inverter circuit, an IGBT is employed as a switching element, and an FWD bypasses/circulates a current which flows through a motor while the IGBT is turned OFF in order that the current flowing through the motor is not changed by switching operations of the IGBT. More concretely speaking, a DC power supply is connected to the motor, if the IGBT which has applied the voltage to the motor is turned OFF, then the current which has flown through the motor passes through the FWD to flow as a reverse DC current due to energy stored in an inductance "L" of the motor. Thus, the motor is brought into a status equivalent to such a condition that the reverse DC voltage is applied to the motor. As a consequence, the current of the motor is not rapidly interrupted by switching the IGBT, so that the AC voltage can be essentially applied from the DC power supply by the switching operation.

IGBTs corresponding to the structural elements of the above-described inverter circuits are mainly classified into a so-called "punch through (PT)" type IGBT, a non-punch through (NPT) type IGBT, and a field stop (FS) type IGBT. The field stop (FS) type IGBT is disclosed in JP-A-2004-103982, and corresponds to an intermediate type IGBT with respect to a PT type IGBT and an NPT type IGBT. A PT type IGBT has such a structure that a P conductivity type ($P^+$) substrate having a thick thickness is employed as a collector layer, and an N conductivity type ($N^+$) buffer layer has been inserted between the collector layer and an N conductivity type ($N^-$) drift layer. An NPT type IGBT has such a structure that a P conductivity type ($P^+$) collector layer has been formed on a rear plane of an N conductivity type ($N^-$) substrate (body layer) having a thin thickness and functioning as a drift layer. Also, an FS type IGBT has such a structure that a buffer layer has been inserted between a drift layer and a collector layer of an NPT type IGBT, and the N conductivity type ($N^-$) substrate (body layer) corresponding to the drift layer has be made thinner. The above-described buffer layer is called as a field stop (FS) layer, and N conductivity type carrier concentration has been designed as low concentration.

As previously described, IGBTs and FWDs have been combined with each other in inverter circuits. Very recently, in order to make the above-described inverter circuits compact, such semiconductor devices have been considered which have been manufactured by parallel-forming IGBT cells and diode cells in a single semiconductor substrate. These semiconductor devices have been disclosed in, for example, JP-A-2005-57235 and JP-A-6-196705. JP-A-2005-57235 has disclosed a semiconductor device manufactured by that an NPT type IGBT is formed in combination with a diode. JP-A-6-196705 has disclosed another semiconductor device manufacture by that both an NPT type IGBT and a PT type IGBT are formed in combination with a diode.

FIG. 14 is a sectional view for schematically indicating a conventional semiconductor device 90, namely a semiconductor device manufactured by that a PT type IGBT has been formed in combination with a diode, which is similar to the semiconductor device disclosed in JP-A-6-196705.

In the semiconductor device 90 shown in FIG. 14, an IGBT and a diode cell have been parallel-formed in a single semiconductor substrate 1. In this semiconductor device 90 of FIG. 14, a region 90i surrounded by a dot and dash line corresponds to the IGBT cell, whereas a region 90d surrounded by a two-dot and dash line corresponds to the diode cell. In this drawing, equivalent circuit symbols have been superimposed with respect to the respective regions to be illustrated. The IGBT 90i is expressed as a structure in which an MOS transistor 90m and a bipolar transistor 90b have been connected to each other in a manner as shown in this drawing. A current flowing through the MOS transistor 90m constitutes a base current of the bipolar transistor 90b.

In the semiconductor device 90 of FIG. 14, an N conductivity type ($N^-$) first semiconductor layer (body layer) 1a formed from the major plane of the semiconductor substrate 1 up to the vicinity of the rear plane thereof is a drift layer of carrier of the IGBT 90i and the diode 90d. A P conductivity type ($P^+$) second semiconductor layer 2 formed in a surface layer portion of the semiconductor substrate 1 on the side of the rear plane-thereof is a collector layer of the IGBT 90i (emitter layer of bipolar transistor 90b). Also, in an N conductivity type ($N^+$) third semiconductor layer 3 formed by covering the second semiconductor layer 2, a region 3a functions as a cathode electrode connection layer of the diode 90d, and another region 3b located over the second semiconductor layer 2 functions as a buffer layer 3b of the IGBT 90i. The region 3a is connected to an electrode of the rear plane and is adjacent to the second semiconductor layer 2.

While the IGBT formed in the semiconductor device 90 of FIG. 14 has the PT type IGBT structure having the buffer layer 3b, since the N body layer 1a corresponding to the drift layer of the carrier can be made thinner, there is a merit that an ON voltage which constitutes the basic characteristic of the IGBT can be lowered.

On the other hand, the Inventors of the present patent application could reveal the below-mentioned problem as a result of analyzing of characteristics as to the semiconductor device 90 of FIG. 14. That is, in the semiconductor device 90 having such a structure that the IGBT 90i having the FS layer (namely, buffer layer) 3b and the diode 90d have been parallel-formed in one semiconductor substrate 1, a snap back occurs in a current-to-voltage ($I_c$-$V_{ce}$) characteristic which constitutes a basic characteristic of an IGBT.

FIG. 15 is a diagram for schematically representing the above-described problem as to the occurrence of the snap back in the current-to-voltage ($I_c$-$V_{ce}$) characteristic.

In a normal IGBT where a snap back does not occur, as indicated by a solid line "XVA" in this drawing, when a voltage $V_{CE}$ is increased from 0 V, a current $I_c$ rises at a threshold voltage $V_{CE(th)}$ of approximately 0.4 to 0.8 V. To the contrary, in an IGBT where a snap back occurs, as shown by an arrow solid line "XVB" of this drawing, even when the voltage $V_{CE}$ is increased from 0 V, the current $I_C$ does not rise from the voltage $V_{CE}$ of several V up to approximately 10 V. When the voltage $V_{CE}$ reaches an operating point "XVC ($V_{CE1}, I_{C1}$)", the voltage $V_{CE}$ jumps up to another operating point "XVD" in a discontinuous manner, and the voltage $V_{CE}$ drops, and then, the current $I_C$ suddenly rises. This discontinuous characteristic corresponds to a snap back phenomenon. A drop voltage $V_{SB}$ shown in FIG. 15 is referred to as a "snap back voltage."

IGBTs where snap backs occur can be hardly controlled. For example, if a snap back happens to occur in IGBTs which are connected parallel to each other, then a distribution of currents becomes unbalanced. As a result, parallel operations of the IGBTs may be troubled. In such a parallel connection system of these IGBTs, in order that essential trouble does not occur in the parallel operations, the snap back voltage $V_{SB}$ is required to be lower than at least the threshold voltage $V_{CE(th)}$.

In other words, in a semiconductor device manufactured by that an IGBT cell having a low ON-voltage and a diode cell have been parallel-formed in a single semiconductor substrate, it is required to suppress an occurrence of a snap back.

DISCLOSURE OF THE INVENTION

In view of the above-described problem, it is an object of the present disclosure to provide a semiconductor device having an IGBT cell and a diode cell and to provide a method for manufacturing the same.

According to a first aspect of the present disclosure, a semiconductor device includes: a semiconductor substrate; an IGBT cell arranged in the semiconductor substrate; and a diode cell arranged in the semiconductor substrate. The semiconductor substrate includes a first semiconductor layer having a first conductive type, a second semiconductor layer having a second conductive type, a third semiconductor layer having the first conductive type and a fourth semiconductor layer having the first conductive type. The first semiconductor layer is arranged on a first surface of the semiconductor substrate. The second semiconductor layer and the third semiconductor layer are arranged on a second surface of the semiconductor substrate, and adjacent to each other. The fourth semiconductor layer is sandwiched between the first semiconductor layer and the second and third semiconductor layers. The first semiconductor layer provides a drift layer of a carrier for the IGBT cell and the diode cell. The second semiconductor layer provides a collector layer of the IGBT cell. The third semiconductor layer provides one of electrode connection layers of the diode cell. A resistivity of the first semiconductor layer is defined as $\rho_1$ [Ω·cm], and a thickness of the first semiconductor layer is defined as $L_1$ [μm]. A resistivity of the fourth semiconductor layer is defined as $\rho_2$ [Ω·cm], and a thickness of the fourth semiconductor layer is defined as $L_2$ [μm]. A half of a minimum width of the second semiconductor layer on a plane parallel to the semiconductor substrate is defined as $W_2$ [μm]. A relationship of $(\rho_1/\rho_2) \times (L_1 \cdot L_2/W_2^2) < 1.6$ is satisfied.

The above semiconductor device is a small semiconductor device having a low on-state voltage FS type IGBT cell and a diode cell, which are arranged in one semiconductor substrate. Further, a snap back is limited from generating in the semiconductor device.

According to a second aspect of the present disclosure, a method for designing the semiconductor device is provided. A resistivity of the first semiconductor layer is defined as $\rho_1$ [Ω·cm], and a thickness of the first semiconductor layer is defined as $L_1$ [μm]. A resistivity of the fourth semiconductor layer is defined as $\rho_2$ [Ω·cm], and a thickness of the fourth semiconductor layer is defined as $L_2$ [μm]. A half of a minimum width of the second semiconductor layer on a plane parallel to the semiconductor substrate is defined as $W_2$ [μm]. The above method includes designing the first semiconductor layer, the second semiconductor layer and the fourth semiconductor layer so as to satisfy a relationship of $(\rho_1/\rho_2) \times (L_1 \cdot L_2/W_2^2) < K$. K is a predetermined constant value.

The above method provides a small semiconductor device having a low on-state voltage FS type IGBT cell and a diode cell, which are arranged in one semiconductor substrate. Further, a snap back is limited from generating in the semiconductor device.

Furthermore, after K is determined, in the semiconductor device having a different combination of $\rho_1$, $L_1$, $\rho_2$, $L_2$ and $W_2$, it is possible to design the semiconductor device having a snap back voltage $V_{SB}$ equal to or smaller than an acceptable value without simulating. Thus, the number of designing steps and a designing cost are much reduced.

BRIEF DESCRIPTION OF THE DRAWINGS

The above and other objects, features and advantages of the present invention will become more apparent from the following detailed description made with reference to the accompanying drawings. In the drawings.

BEST MODES FOR CARRYING OUT THE INVENTION

Figure 1:
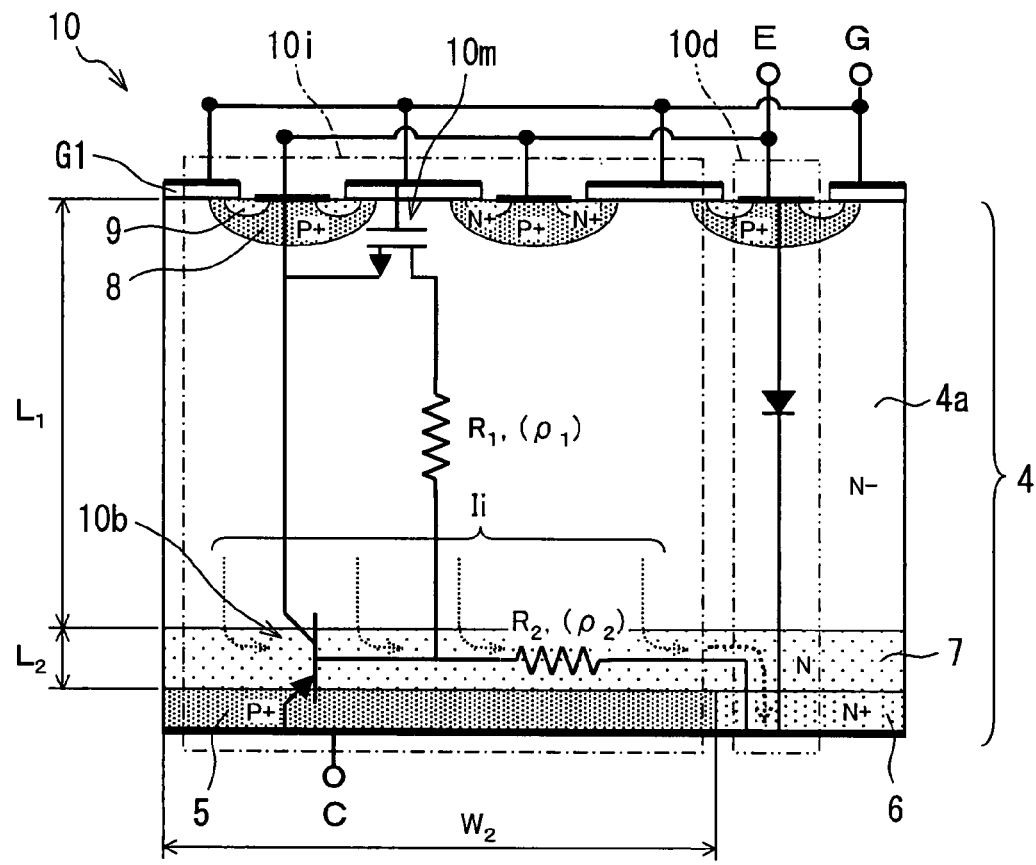
FIG. 1 is a diagram for explaining a basic structure of a semiconductor device 10 of the present invention, namely a sectional view for schematically indicating the semiconductor device 10.

FIG. 1 is a diagram for explaining a basic structure of a semiconductor device 10 of the first embodiment of the present invention, namely a sectional view for schematically indicating the semiconductor device 10.

The semiconductor device 10 shown in FIG. 1 is a semiconductor device manufactured by forming an IGBT cell and a diode cell in a single semiconductor substrate 4 in a parallel manner. In this drawing, a region 10i surrounded by a dot and dash line corresponds to the IGBT cell, whereas a region 10d surrounded by a two-dot and dash line corresponds to the diode cell. In this drawing, equivalent circuit symbols have been superimposed with respect to the respective regions to be illustrated. The IGBT 10i is expressed as a structure in which an MOS transistor 10m and a bipolar transistor 10b have been connected to each other in a manner as shown in this drawing. A current flowing through the MOS transistor 10m constitutes a base current of the bipolar transistor 10b.

In the semiconductor device 10 of FIG. 1, an N conductivity type (N⁻) first semiconductor layer (body layer) 4a formed from a major plane of the semiconductor substrate 4 up to the vicinity of the rear plane thereof is used as a drift layer of carries of the IGBT cell 10i and the diode cell 10d. In the semiconductor device 10, a P conductivity type (P⁺) first semiconductor layer 8 has been formed in a surface layer portion of the semiconductor substrate 4 on the side of the main plane thereof, and an N conductivity type (N⁺) second semiconductor region has been formed in the first semiconductor region 8. Also, a common electrode which is commonly connected to both the first semiconductor region 8 and the second semiconductor region 9 corresponds to an emitter electrode (E) of the IGBT cell 10i, and also, to an anode electrode of the diode cell 10d. It should also be noted that a portion of symbol G1 is a gate oxide film, and the IGBT cell 10i in the semiconductor device 10 shown in FIG. 1 constitutes a gate electrode (G) having a plane structure.

Further, in the semiconductor device 10, a P conductivity type (P⁺) second semiconductor layer 5 and an N conductivity type (N⁺) third semiconductor layer 6 which have been formed adjacent to a surface portion of the semiconductor substrate 4 on the rear plane side are used as a collector layer of the IGBT cell 10i and a cathode electrode connection layer of the diode cell 10d, respectively. A common electrode (C) made of an integral body has been connected to the second semiconductor layer 5 and the third semiconductor layer 6. Also, in the semiconductor device 10, an N conductivity type (N) fourth semiconductor layer 7 has been formed among the first semiconductor layer 4a, the second semiconductor layer 5, and the third semiconductor layer 6.

The diode cell 10d in the semiconductor device 10 is constituted by the first semiconductor region 8, the first semiconductor layer 4a, the fourth semiconductor layer 7, and the third semiconductor layer 6. The diode cell 10d commonly uses as an anode region the first semiconductor region 8 corresponding to a channel forming region of the IGBT cell 10i, and is so called as a "body diode cell." In FIG. 1, for the sake of simple illustrations, only the first semiconductor region 8 shown in the right side has been surrounded by the two-dot and dash line and has been described as the diode cell 10d. However, the first semiconductor regions 8 illustrated at a center and a left side may also function as the diode cell 10d.

In the semiconductor device 10 shown in FIG. 1, both the IGBT cell 10i and the diode cell 10d have been parallel-formed in one semiconductor substrate 4. Also, in the IGBT cell 10i, the fourth semiconductor layer 7 corresponding to a field stop (FS) layer has been formed between the first semiconductor layer 4a corresponding to a drift layer of a carrier, and the second semiconductor layer 5 corresponding to a collector layer. As a consequence, similar to the semiconductor device 90 of FIG. 14, the semiconductor device 10 of FIG. 1 has been manufactured as such a compact semiconductor device made by parallel-forming an FS type IGBT cell having a low ON-voltage and a diode cell in a single semiconductor substrate.

Figure 14:
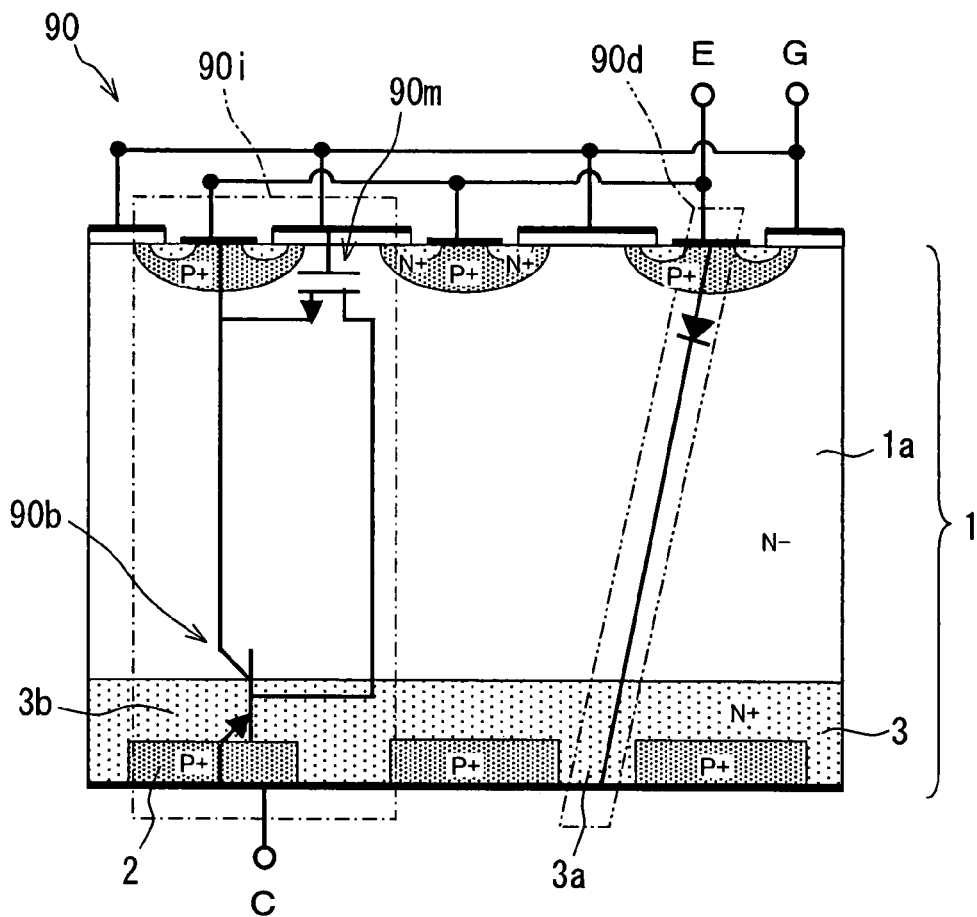
FIG. 14 is a sectional view for schematically indicating the conventional semiconductor device 90.

On the other hand, although the semiconductor device 10 of FIG. 1 has a similar structure to that of the semiconductor device 90 of FIG. 14, this semiconductor device 10 has the following different structure. That is, a clear relationship is set with respect to thicknesses and resistivities of the first semiconductor layer 4a and the fourth semiconductor layer 7, and also, a minimum width of the second semiconductor layer 5 within the substrate plane. That is to say, assuming now that a resistivity of the first semiconductor layer 4a is $\rho_1$ [Ω·cm] and a thickness of the first semiconductor layer 4a is $L_1$ [μm]; a resistivity of the fourth semiconductor layer 7 is $\rho_2$ [Ω·cm] and a thickness of the fourth semiconductor layer 7 is $L_2$ [μm]; and ½ of the minimum width of the second semiconductor layer 5 within the substrate plane is $W_2$ [μm], in the semiconductor device 10 of FIG. 1, the below-mentioned relationship can be satisfied:

$$(\rho_1/\rho_2) \times (L_1 \cdot L_2/W_2^2) < 1.6 \quad \text{(Formula 1)}$$

The relationship of the above-described formula 1 is established based upon the below-mentioned simulation result. In the semiconductor device 10 of FIG. 1, the parameters $\rho_1$, $L_1$, $\rho_2$, $L_2$ and $W_2$ have been set in such a manner that these parameters can satisfy the formula 1. As a result, in the semiconductor device 10, a snap back voltage "$V_{SB}$" occurred in the IGBT cell 10i can be decreased lower than a threshold voltage $V_{CE(th)}$=0.8 V at a temperature of −40° C. which is equal to a maximum value under general use environment.

Next, a description is made of stages for conducting the relationship of the above-described formula 1 in the semiconductor device 10 of FIG. 1.

Firstly, the reason why a snap back occurs in a current-to-voltage characteristic of an IGBT in a semiconductor device manufactured by parallel-forming an IGBT cell and a diode cell will now be described by employing an equivalent circuit.

Figure 2:
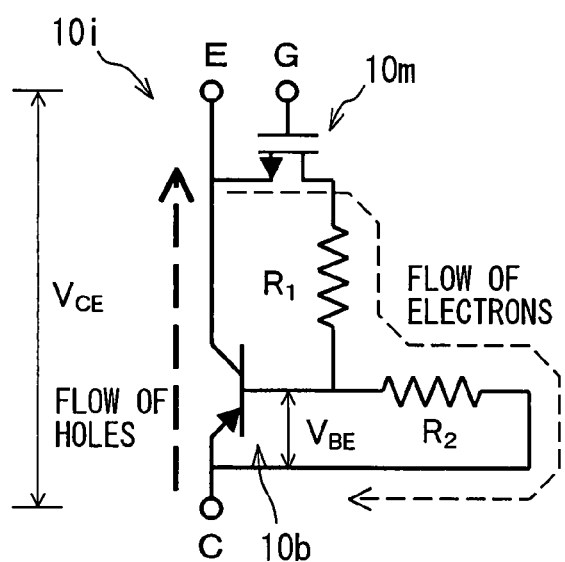
FIG. 2 is a diagram for showing an equivalent circuit of an IGBT cell 10$i$ shown in FIG. 1, which is derived from the semiconductor device 10 of FIG. 1.

FIG. 2 is a diagram for showing an equivalent circuit of the IGBT cell 10*i* which is extracted from the semiconductor device 10 of FIG. 1.

In the equivalent circuit of the IGBT cell 10*i* shown in FIG. 1 and FIG. 2, a resistor "$R_1$" has been taken into account, which is not indicated in the equivalent circuit of the IGBT cell 90*i* of FIG. 14. This resistor $R_1$ is a resistance value of the first semiconductor layer (body layer) 4*a* along a longitudinal direction, while the first semiconductor layer 4*a* is the drift layer of the carrier. Also, in the semiconductor device 10 of FIG. 1, the width "$W_2$" of the second semiconductor layer 5 within the substrate plane, which is shown in the drawing, is set to be large, as compared with that of the conventional semiconductor device 90 shown in FIG. 14. As a consequence, in the equivalent circuit of the IGBT cell 10*i* shown in FIG. 1 and FIG. 2, a resistor "$R_2$" of the fourth semiconductor layer (field stop layer) 7 along a lateral direction is also considered.

In the beginning, a snap back will now be considered.

Figure 15:
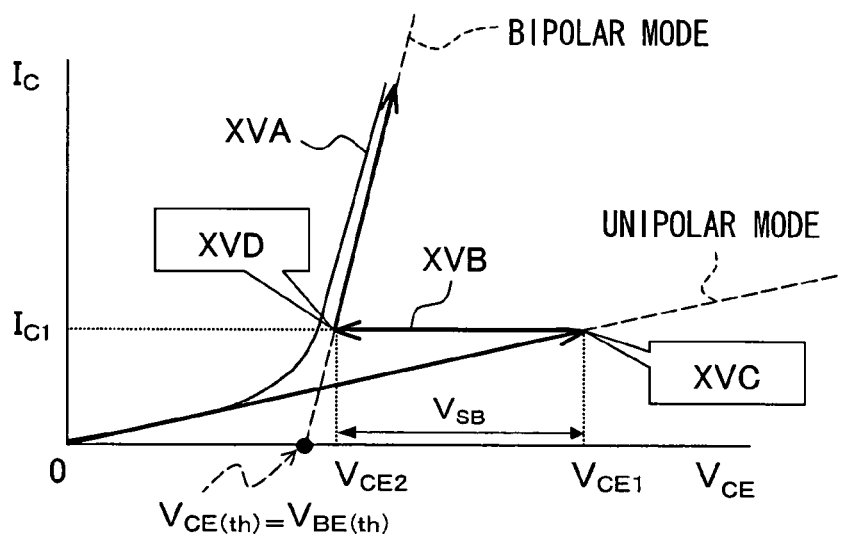
FIG. 15 is a diagram for schematically representing the occurrence problem of the snap back in the current-to-voltage ($I_c$-$V_{ce}$) characteristic.

A snap back implies such a phenomenon that in FIG. 15, when the voltage $V_{CE}$ is increased from 0 V, the voltage jumps from the operating point XVC ($V_{CE1}$, $I_{C1}$) of a unipolar mode to the operating point XVC ($V_{CE2}$, $I_{C1}$) of a bipolar mode. A change amount ($V_{CE1} - V_{CE2}$) of the voltage $V_{CE}$ corresponds to the snap back voltage $V_{SB}$.

The unipolar mode (origin to operating point XVC) implies such an operation state that in the equivalent circuit diagram of FIG. 2, only the MOS transistor (MOSFET) 10*m* is operated, and thus, only a flow of electrons is present. This electron flow is indicated by a narrow broken line in this drawing. Under this operation condition, the bipolar transistor 10*b* has not yet been operated, so that there is no flow of holes shown by a wide broken line in the drawing. As a consequence, while there is no conductivity modulation of the body layer 4*a*, both the resistor $R_1$ of the body layer 4*a* and the resistor $R_2$ of the field stop layer 7 may have such values which are determined based upon carrier concentration defined by impurity doping. As a consequence, the I-V characteristic of the unipolar mode represents a straight line which passes through the origin, as indicated in FIG. 15, and an inclination thereof is given by $1/(R_1+R_2)$.

In the equivalent circuit diagram of FIG. 2, a voltage drop caused by the resistor $R_2$ is equal to a base (base-to-emitter) voltage "$V_{BE}$" of the bipolar transistor 10*b*. In the operating point XVC ($V_{CE1}$, $I_{C1}$) of FIG. 15, when the voltage drop caused by the resistor $R_2$ shown in FIG. 2 exceeds a threshold base voltage "$V_{BE(th)}$" (namely, approximately 0.6 V at room temperature) and then the operation of the bipolar transistor 10*b* is commenced, holes are injected from the second semiconductor layer 5 via the field stop layer 7 into the body layer 4*a*. The second semiconductor layer 5 corresponds to the emitter of the bipolar transistor 10*b*. Accordingly, the conductivity of the body layer 4*a* is modulated, so that the resistor $R_1$ thereof is largely lowered. As a result, under the same collector current $I_{C1}$, the collector voltage is lowered from $V_{CE1}$ to $V_{CE2}$. In other words, as shown in FIG. 15, a so-called "snap back" occurs in which the collector voltage jumps from the operating point XVC to the operating point XVD.

The operating point XVD indicated in FIG. 15 corresponds to a point located on the bipolar mode in the I-V characteristic, a so-called "ON state" of the IGBT, namely, an operation starting point of the bipolar transistor 10*b* of FIG. 2. As can be understood from the above description, the threshold voltage $V_{CE(th)}$ of the IGBT shown in FIG. 15 is equal to the threshold base voltage $V_{BE(th)}$ of the bipolar transistor 10*b*. The threshold base voltage $V_{BE(th)}$ (namely, threshold voltage $V_{CE(th)}$ of IGBT) of the bipolar transistor 10*b* is nearly equal to 0.4 V under use environment of −40° C. to 150° C. The lower the temperature becomes, the higher the threshold base voltage $V_{BE(th)}$ becomes. At the room temperature, the threshold base voltage $V_{BE(th)}$ is nearly equal to 0.6V.

Next, a suppressing condition as to the snap back will now be considered.

In order to suppress the snap back, it is required to reduce the snap back voltage $V_{SB}$.

When the snap back voltage $V_{SB}$ is expressed by $R_1$, $R_2$, and $V_{BE(th)}$, the below-mentioned formulae are obtained:

From FIG. 15, the snap back voltage $V_{SB}$ is given as follows:

$$V_{SB} = V_{CE1} - V_{CE2} \quad \text{(Formula 7)}$$

Also, based upon a voltage dividing relationship of FIG. 2 at the operating point XVC of FIG. 15, there is the below-mentioned relationship:

$$V_{CE1} = V_{BE(th)} \times (R_1 + R_2)/R_2 \quad \text{(Formula 8)}$$

Also, as shown in FIG. 15, the voltage $V_{CE2}$ of the operating point XVD is given as follows:

$$V_{CE2} \sim V_{BE(th)} \quad \text{(Formula 9)}$$

Next, in such a case that the snap back voltage $V_{SB}$ is low, the below-mentioned relationship is obtained based upon the above-described formulae 7 to 9 in accordance with a first order approximation:

$$V_{SB}/V_{BE(th)} \sim R_1/R_2 \quad \text{(Formula 10)}$$

Next, in order to reduce the snap back voltage $V_{SB}$ lower than the threshold base voltage $V_{BE(th)}$ of the bipolar transistor 10*b*, the below-mentioned relationship is established:

$$V_{SB}/V_{BE(th)} < 1 \quad \text{(Formula 11)}$$

As a consequence, based upon the above-described formula 10, in this case, the below-mentioned relationship is required between the resistor $R_1$ and the resistor $R_2$ of FIG. 2:

$$R_1/R_2 < 1 \quad \text{(Formula 12)}$$

In this case, as in the below-mentioned description, the relationship of the above-explained formula 11 by which the snap back voltage $V_{SB}$ is selected to be the lower voltage than the threshold base voltage $V_{BE(th)}$ of the bipolar transistor 10*b* may constitute the necessary condition even in such a case that IGBTs are actually operated in a parallel mode. In other words, if the snap back voltage $V_{SB}$ becomes high, in the case that the IGBT elements are connected parallel to each other and the parallel-connected IGBT elements are driven, there is a problem that a current distribution becomes unbalanced.

Figure 3A:
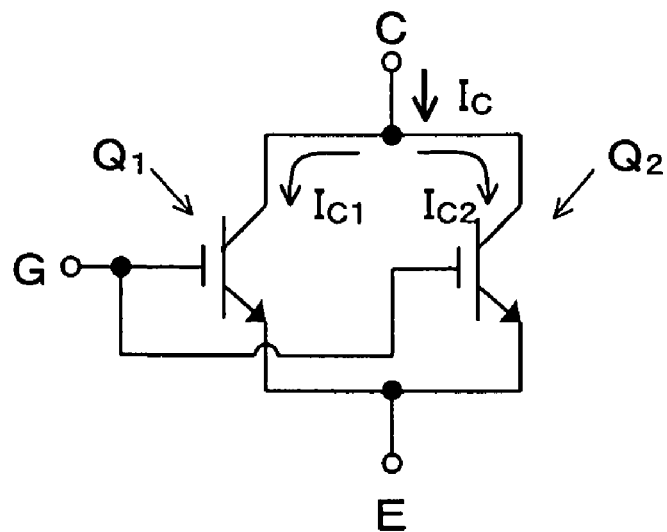
FIG. 3A shows a circuit diagram in which 2 sets of IGBT elements $Q_1$ and $Q_2$ are connected parallel to each other.
Figure 3B:
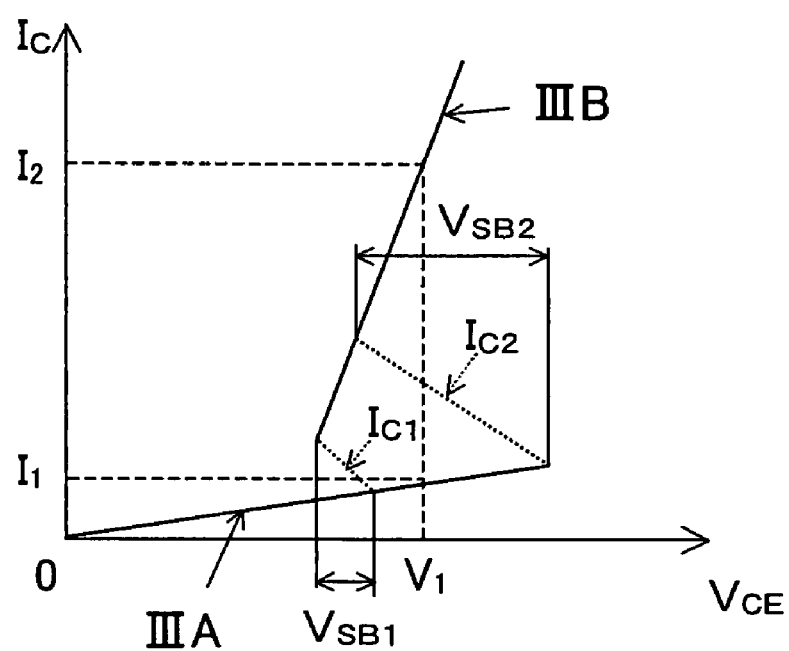
FIG. 3B is a diagram for representing an I-V characteristic as to the two IGBT elements $Q_1$ and $Q_2$ shown in FIG. 3A.

FIG. 3A and FIG. 3B are diagrams for explaining contents of the above-described problem. FIG. 3A is a circuit diagram in which two pieces of IGBT elements $Q_1$ and $Q_2$ are connected parallel to each other, and FIG. 3B is a diagram for representing an I-V characteristic of the two IGBT elements $Q_1$ and $Q_2$ shown in FIG. 3A.

As indicated FIG. 3B, assuming now that the snap back voltages of these two IGBT elements $Q_1$ and $Q_2$ are "$V_{SB1}$" and "$V_{SB2}$" respectively, such a case of $V_{SB1} < V_{SB2}$ is employed as an example, and then, the following description is made.

When the voltage $V_{CE}$ is increased from 0 V, currents $I_{C1}$ and $I_{C2}$ flowing through the respective IGBT elements $Q_1$ and $Q_2$ shown in FIG. 3A are increased under condition of $I_{C1} = I_{C2}$ along a line IIIA shown in FIG. 3B in the beginning stage.

Next, if the voltage $V_{CE}$ reaches such a voltage that a snap back occurs in the IGBT element $Q_1$, then the currents $I_{C1}$ and $I_{C2}$ flowing through the respective IGBT elements $Q_1$ and $Q_2$ are given by:

$$I_{C1} > I_{C2} \quad \text{(Formula 13)}$$

Thus, an unbalanced state occurs.

When the voltage $V_{CE}$ is further increased, the entire $I_C$ (to $I_{C1}$) is increased along a line IIIB, so that the unbalanced status of the currents $I_{C1}$ and $I_{C2}$ flowing through the respective IGBT elements $Q_1$ and $Q_2$ is enlarged. For instance, if the voltage $V_{CE}$ is increased to a voltage V1, then the current $I_{C1}$ flowing through the IGBT element $Q_1$ becomes a current "$I_2$" and the current$_{C2}$ flowing through the IGBT element $Q_2$ becomes a current "$I_1$", and the following relationship is given:

$$I_2 \gg I_1 \quad \text{(Formula 14)}$$

This unbalanced state is continued until the voltage $V_{CE}$ reaches such a voltage that a snap back occurs in the IGBT element $Q_2$.

As previously described, if the snap back voltages $V_{SB}$ are different from each other as explained in the IGBT elements $Q_1$ and $Q_2$ which are connected parallel to each other, then a problem occurs in the parallel operation. Also, even when the snap voltages $V_{SB}$ of the respective IGBT elements $Q_1$ and $Q_2$ are matched to be nearly equal to each other, since the snap back voltages $V_{SB}$ have temperature dependent characteristics, the above-explained problem occurs even by a small difference. In an actual case, in order that the above-described problem does not occur, the snap back voltage $V_{SB}$ must be lower than, or equal to the base-to-emitter voltage "$V_{BE(th)}$" when the bipolar transistors of the IGBT elements $Q_1$ and $Q_2$ are operated.

Returning back to the relationship of the above-described formula 12, in order to simulate the I-V characteristic of the semiconductor device 10 shown in FIG. 1, the resistors $R_1$ and $R_2$ are rewritten by employing the structural parameters ($\rho_1$, $L_1$, $\rho_2$, $L_2$, $W_2$) shown in FIG. 1. This reason is given as follows: That is, the formula 12 is a formula which is conducted from an equivalent circuit which is simplified by the concentrated constants of FIG. 2, and the characteristic which is obtained from the structure of the actual semiconductor device 10 shown in FIG. 1 is more correctly expressed by employing "$\rho_1$" and "$\rho_2$" which correspond to distributed constants. For example, in the unipolar mode, electrons flowing through the internal portion of the semiconductor device 10 along the longitudinal direction are actually distributed in a continuous manner as indicated by arrow dot lines "li" in FIG. 1, and resistances received by the electrons flown into the fourth semiconductor layer 7 are different from each other, depending upon electron flowing positions. As a consequence, in order to correctly evaluate the I-V characteristic, device simulation must be carried out by considering the structural parameters.

In FIG. 1, in the case that a resistively of the first semiconductor layer 4a is $\rho_1$ [Ω·cm] and a thickness of the first semiconductor layer 4a is $L_1$ [µm]; a resistively of the fourth semiconductor layer 7 is $\rho_2$ [Ω·cm] and a thickness of the fourth semiconductor layer 7 is $L_2$ [µm]; and a width of the second semiconductor layer 5 is $W_2$ [µm], the below-mentioned relationship can be established:

$$R_1 \propto \rho_1 \times L_1/W_2 \quad \text{(Formula 15)}$$

$$R_2 \propto \rho_2 \times L_2/W_2 \quad \text{(Formula 16)}$$

It should also be understood that the below-mentioned device simulation is carried out while a left end of the semiconductor device 10 shown in FIG. 1 is defined as a symmetrical axis. As a consequence, the width $W_2$ of the second semiconductor layer 5 shown in FIG. 1 is equal to ½ of a minimum width within the substrate plane in the second semiconductor layer 5 having an arbitrary shape.

If the formula (15) and the formula (16) are substituted for the formula 12 so as to delete the resistors $R_1$ and $R_2$, then the below-mentioned relationship is obtained:

$$a_f \times (\rho_1/\rho_2) \times \{L_1 \cdot L_2/W_2^2\} < 1 \quad \text{(Formula 17)}$$

A factor "$a_f$" conducted in the formula 17 is a shape factor which is produced by rewriting $R_1$ and $R_2$ (=concentrated constants) into $\rho_1$ and $\rho_2$ (=distributed constants), and corresponds to such a factor nearly equal to 1. When the formula (17) is rewritten, the below-mentioned formula (18) is given:

$$(\rho_1/\rho_2) \times (L_1 \cdot L_2/W_2^2) < K \quad \text{(Formula 18)}$$

Thus, the above-explained relationship of the formula 6 is conducted. In this case, symbol "k(=1/$a_f$)" is a constant in the formula 18.

The above-described formula (18) corresponds to the suppressing condition of the snap back conducted from the consideration of the equivalent circuit, and it can be understood that 5 pieces of the structural parameters ($\rho_1$, $L_1$, $\rho_2$, $L_2$, $W_2$) are related to the suppression of the snap back in the semiconductor device 10 shown in FIG. 1 based upon the above-explained analysis.

In order to design the semiconductor device 10 capable of suppressing the occurrence of the snap back by employing the formula (18), symbol "K" of a right hand in the formula (18) can be handled as a constant with respect to an allowable snap back voltage $V_{SB}$, and this constant value "K" may be previously determined by simulating snap back voltages $V_{SB}$ as to several pieces of models having different structural parameters ($\rho_1$, $L_1$, $\rho_2$, $L_2$, $W_2$). If the constant value "K" is once determined, then such semiconductor devices whose snap back voltages are lower than, or equal to the allowable snap back voltage $V_{SB}$, while arbitrary semiconductor devices having different structural parameters ($\rho_1$, $L_1$, $\rho_2$, $L_2$, $W_2$) need not be simulated. As a result, designing steps and designing cost can be largely reduced.

Next, with respect to several models having different structural parameters ($\rho_1$, $L_1$, $\rho_2$, $L_2$, $W_2$), simulation results for simulating the characteristic of the semiconductor device 10 shown in FIG. 1 are shown.

Figures 4A, 4B:
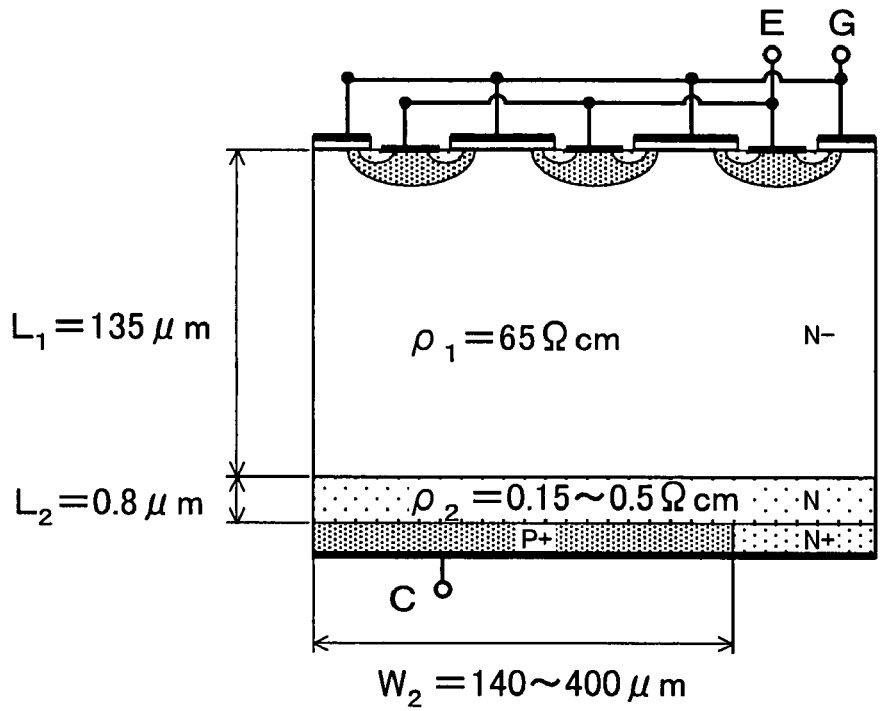
FIG. 4A is a diagram for indicating typical numeral values of structural parameters ($\rho_1$, $L_1$, $\rho_2$, $L_2$, $W_2$) used in simulation.
FIG. 4B is a diagram for indicating a condition of structural parameters ($\rho_2$, $\rho_2$, $L_1$, $L_2$) which is employed so as to manufacture an IGBT cell having a withstanding voltage of 600 V, and another IGBT cell having a withstanding voltage of 1200 V.

FIG. 4A is a diagram for indicating typical numeral values of the structural parameters ($\rho_1$, $L_1$, $\rho_2$, $L_2$, $W_2$) which are employed in the simulation.

Among 5 pieces of the above-described structural parameters ($\rho_1$, $L_1$, $\rho_2$, $L_2$, $W_2$), the structural parameters, $\rho_1$ and $L_1$ related to the first semiconductor layer 4a may give a large influence to a withstanding voltage of an IGBT cell, whereas the structural parameters $\rho_2$ and $L_2$ related to the fourth semiconductor layer 7 may give a large influence to a switching characteristic of the IGBT cell. As previously explained, since the parameters $\rho_1$ and $L_1$ are substantially determined based upon the withstanding voltage of the IGBT cell, and also, the parameters $\rho_2$ and $L_2$ are substantially determined based upon the switching characteristic of the IGBT cell, a design freedom is low, and only the width $W_2$ of the second semiconductor layer 5 can be relatively freely designed.

FIG. 4B represents conditions of the structural parameters ($\rho_1$, $\rho_2$, $L_1$, $L_2$) as a table. These conditions are designed for realizing IGBT cells having a withstanding voltage of 600 V and another withstanding voltage of 1200 V, which are generally required in an on-vehicle type inverter, assuming now that the semiconductor device 10 shown in FIG. 1 is applied to the on-vehicle type inverter. In order to secure necessary switching characteristics and also secure the standard withstanding voltage of 100 V which is required in a general-purpose on-vehicle inverter, these structural parameters of $\rho_1$, $\rho_2$, $L_1$, and $L_2$ are required to be set to $\rho_1 > 20$ [Ω·cm], $\rho_2 < 1.0$ [Ω·cm], $L_1 > 40$ [µm], and $L_2 > 0.5$ [µm]; or $\rho_1 > 20$ [Ω·cm], $\rho_2 < 1.0$ [Ω·cm], $L_1 > 40$ [µm], and $L_2 > 0.5$ [µm]. More specifically, in the latter case, since $L_2$ is large, $\rho_2$ can be set to be high. As a result, the withstanding voltage of the semiconductor device 10 with respect to a surge voltage can be increased.

Also, in such a case that these structural parameters of $\rho_1$, $\rho_2$, $L_1$, $L_2$ are equal to $\rho_1 > 40$ [Ω·cm], $\rho_2 < 1.0$ [Ω·cm], $L_1 > 80$ [µm], and $L_2 > 0.5$ [µm]; or $\rho_1 > 40$ [Ω·cm], $\rho_2 < 1.0$ [Ω·cm], $L_1 > 80$ [µm], and $L_2 > 5.0$ [µm], it is especially possible to secure the standard withstanding voltage of 1200 V which is required for an on-vehicle inverter having a high withstanding voltage. Also, in this case, especially, as to the latter case, since $L_2$ is large, $\rho_2$ can be set to be high. As a result, the withstanding voltage of the semiconductor device 10 with respective to a surge voltage can be increased.

Figure 5:
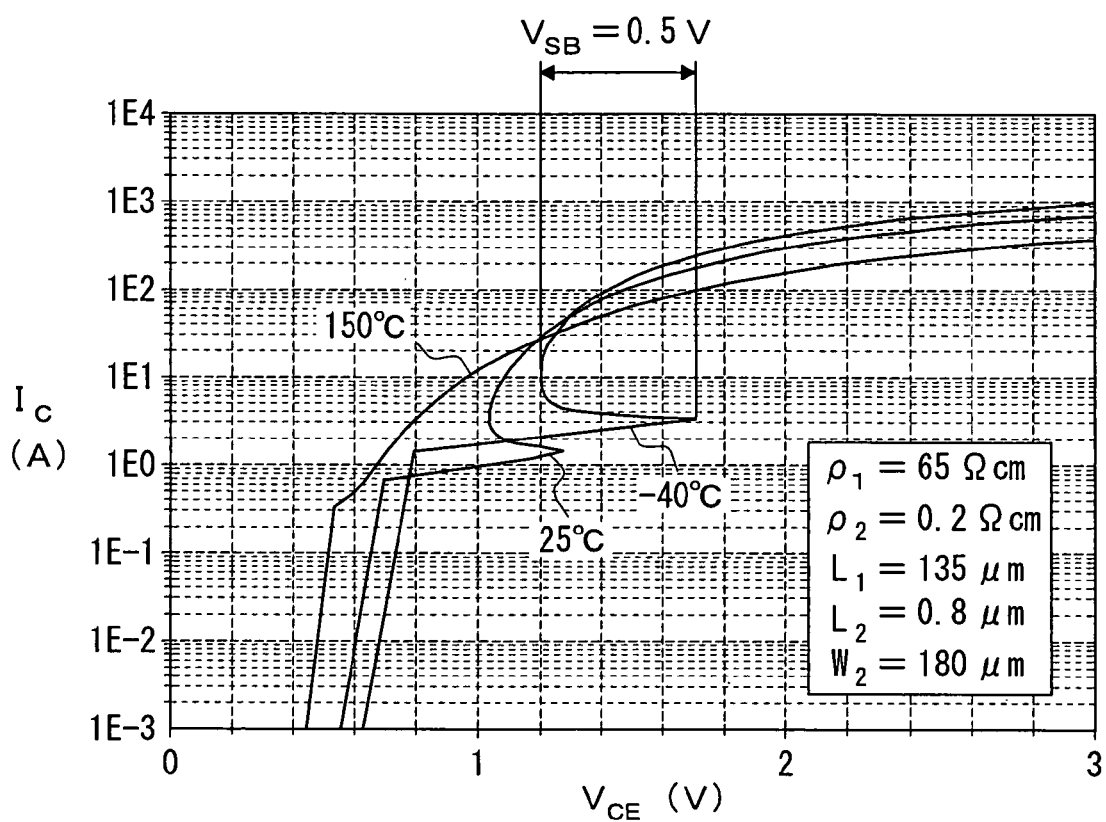
FIG. 5 is a diagram for showing a simulation result of a typical I-V characteristic.

FIG. 5 is a diagram for representing a simulation result as to a typical I-V characteristic in the case of the following setting conditions: $\rho_1 = 65$ [Ω·cm], $\rho_2 = 0.2$ [Ω·cm], $L_1 = 135$ [µm], $L_2 = 0.8$ [µm] and W=180 [µm].

FIG. 5 indicates simulation results under 3 temperature conditions where the threshold base voltages $V_{BE(th)}$ (threshold voltage $V_{CE(th)}$ of IGBT) of the bipolar transistor are different from each other. As exemplified in this drawing, for instance, a snap back voltage $V_{SB}=0.5$ V obtained from the simulation can be read from the I-V characteristic of the temperature of −40° C.

Figures 6A, 6B, 6C:
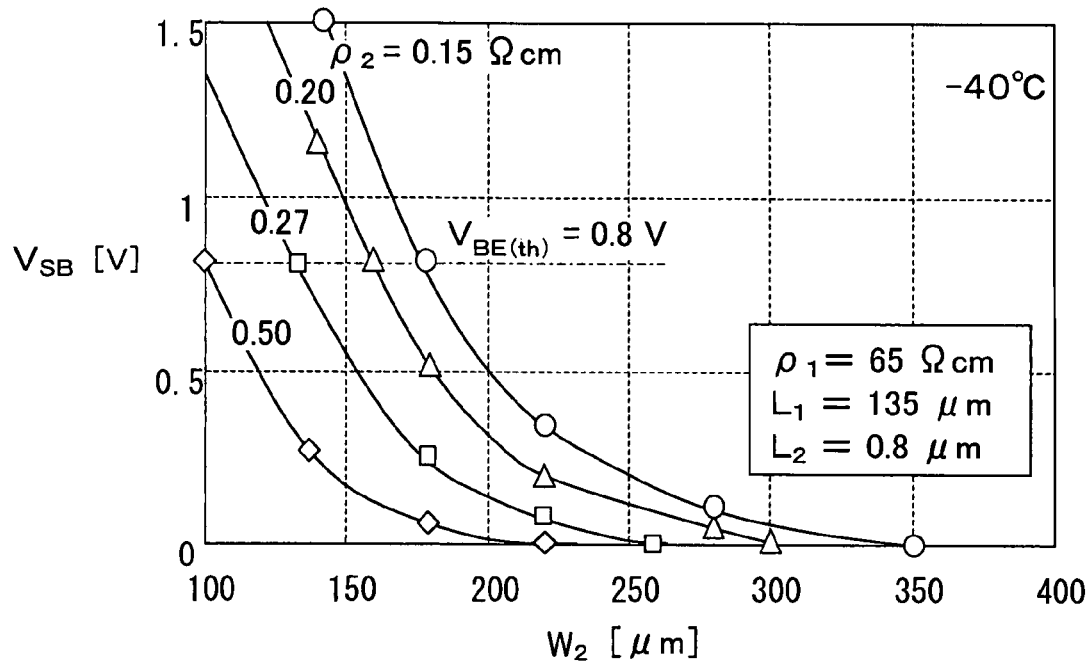
FIG. 6A is a diagram for representing snap back voltages $V_{SB}$ in a collected manner, which are obtained from simulation results, while $\rho_2$ and $W_2$ are employed as parameters.
FIG. 6B and FIG. 6C are diagrams for representing combinations of $\rho_2$ and $W_2$, and $k=(\rho_1/\rho_2)(L_1 \cdot L_2/W_2^2)$ as to such a case that the snap back voltage $V_{SB}$ becomes equal to 0.8 V and is negligible (for example, lower than 0.1 V)

FIG. 6A is a diagram for indicating snap voltages $V_{SB}$ obtained from the simulation results together, while $\rho_2$ and $W_2$ are employed as parameters.

Also, FIG. 6B and FIG. 6C represent combinations of $\rho_2$ and $W_2$ as tables by calculating these parameter combinations and the left hand of the above-described formula (18), namely the combinations of the parameters $\rho_2$ and $W_2$ in such a case that the snap back voltage $V_{SB}$ in FIG. 6A becomes equal to 0.8 V of the threshold base voltage $V_{BE(th)}$ of the bipolar transistor (namely, threshold voltage $V_{CE(th)}$ of IGBT) at the temperature of −40° C., which corresponds to the maximum value under normal use environment, and further, the snap back voltage $V_{SB}$ can be substantially neglected (lower than 0.1 V), as compared with the threshold base voltage $V_{BE(th)}$. The left hand of the above-described formula (18) is given as follows:

$$k = (\rho_1/\rho_2) \times (L_1 \cdot L_2/W_2^2) \quad \text{(Formula 19)}$$

As can be seen from the tables of FIG. 6B and FIG. 6C, when the allowable snap back voltages $V_{SB}$ are set to predetermined values with respect to the threshold base voltage $V_{BE(th)}$ of the bipolar transistor, the values "K" of the formula 19 which are calculated from the structural parameters ($\rho_1$, $L_1$, $\rho_2$, $L_2$, $W_2$) capable of satisfying it become substantially constant values. As indicated in FIG. 6B, in case that $V_{SB}$ is nearly equal to $V_{BE(th)} \cong 0.8$ V, the value "K" is equal to approximately 1.4 to 1.5. As shown in FIG. 6C, in case that $V_{SB}$ is nearly equal to 0 V, the value "K" is equal to approximately 0.39.

As a consequence, the semiconductor device 10 shown in FIG. 1 and having arbitrary structural parameters ($\rho_1$, $L_1$, $\rho_2$, $L_2$, $W_2$) may become such a semiconductor device that the allowable snap back voltage $V_{SB}$ is lower than, or equal to 0.8 V, while the arbitrary structural parameters can satisfy the below-mentioned formula (20) under the condition that the value "K" of the right hand of the formula (18) is defined as K=1.6:

$$(\rho_1/\rho_2) \times (L_1 \cdot L_2/W_2^2) < 1.6 \quad \text{(Formula 20)}$$

The previously indicated relationship of the formula (1) can be conducted in the above-explained manner.

Similarly, in the semiconductor device 10 shown in FIG. 1 and having arbitrary structural parameters ($\rho_1$, $L_1$, $\rho_2$, $L_2$, $W_2$), the allowable snap back voltage $V_{SB}$ may be substantially neglected (lower than 0 V), while the arbitrary structural parameters can satisfy the below-mentioned formula (21) under the condition that the value "K" of the right hand of the formula (18) is defined as K=0.4:

$$(\rho_1/\rho_2) \times (L_1 \cdot L_2/W_2^2) < 0.4 \quad \text{(Formula 21)}$$

The previously indicated relationship of the formula (2) can be conducted in the above-explained manner.

Figure 7:
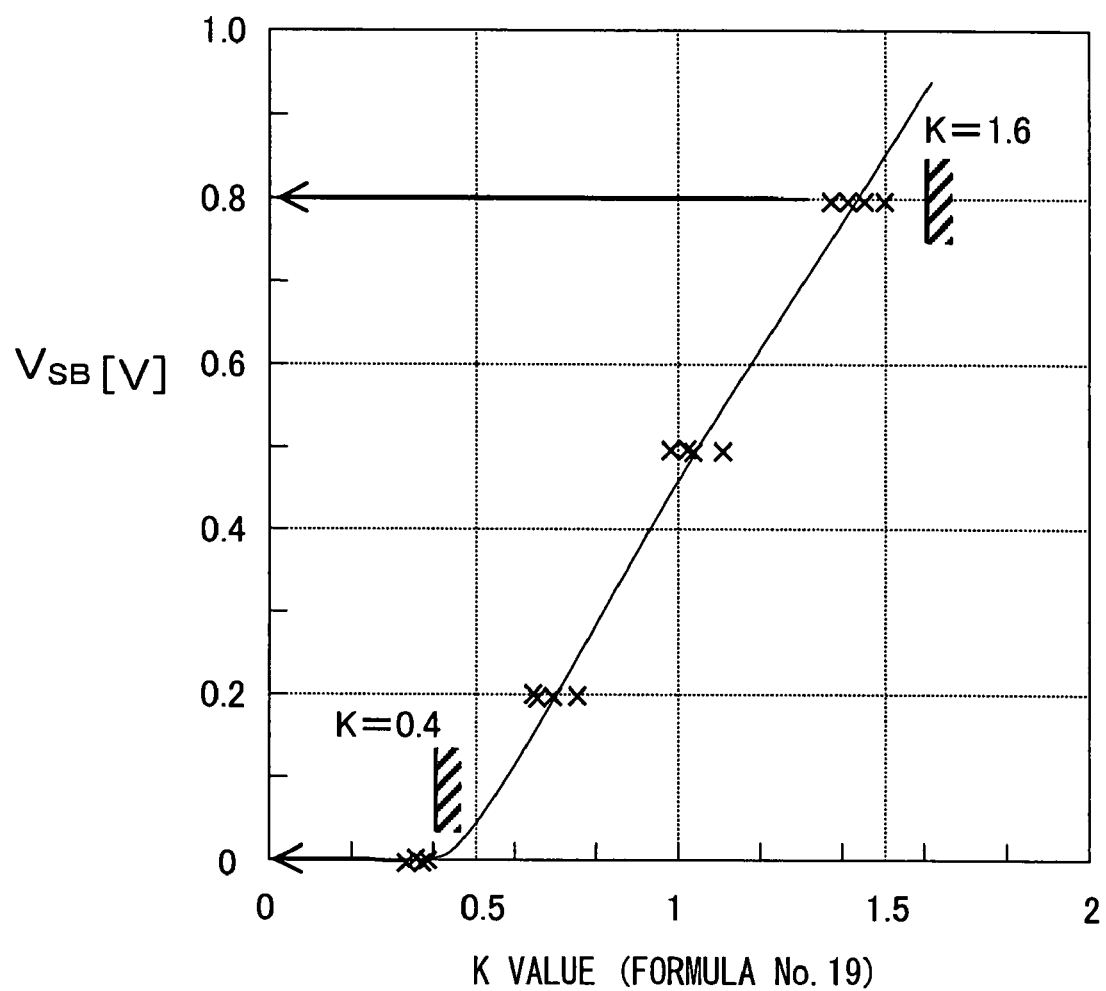
FIG. 7 is a diagram for showing a relationship between the snap back voltage $V_{SB}$ obtained from the simulation result and a value "K" of a formula 19, and another relationship between the snap back voltage $V_{SB}$, and K of the formula 19 set in order that the snap back voltage $V_{SB}$ is selected to be lower than, or equal to either 0.8 V or 0 V.

FIG. 7 is a diagram for indicating both a relationship between the value "K" of the formula (19) and the snap back voltage $V_{SB}$ obtained from the above-described simulation result in combination with another relationship between the snap back voltage $V_{SB}$ and the value "K" of the formula (19) set in order that the snap back voltage $V_{SB}$ is selected to be lower than, or equal to 0.8 V, or be equal to 0 V.

As previously described, in such a case that the semiconductor device 10 of FIG. 1 where the occurrence of the snap back is suppressed is designed, if the values of "K" are determined based upon several simulation models with respect to the allowable snap back voltage $V_{SB}$ as realized in the formula (19) and the formula (20), while the arbitrary semiconductor devices having the different structural parameters ($\rho_1$, $L_1$, $\rho_2$, $L_2$, $W_2$) are not subsequently simulated, such a semiconductor device whose snap back voltage is lower than, or equal to the allowable snap back voltage $V_{SB}$ can be designed. As a consequence, the designing steps and the designing cost can be largely reduced.

Also, in such a case that the structural parameters ($\rho_1$, $\rho_2$, $L_1$, $L_2$) take, for example, the limit value of the withstanding voltage of 600 V shown in FIG. 4B, in order that the snap pack voltage $V_{SB}$ is nearly equal to $V_{BE(th)} \cong 0.8$ V, the following fact, can be understood from the formula 20: That is, in the semiconductor device 10 of FIG. 1, the width $W_2$ must be made larger than 32 [µm]. This width $W_2$ is ½ of the minimum width of the second semiconductor layer 5 within the substrate plane. Similarly, in such a case that the structural parameters ($\rho_1$, $\rho_2$, $L_1$, $L_2$) take, for example, the limit value of the withstanding voltage of 1200 V shown in FIG. 4B, in order that the snap pack voltage $V_{SB}$ is nearly equal to $V_{BE(th)} \cong 0.8$ V, the following fact can be understood from the formula 20: That is, in the semiconductor device 10 of FIG. 1, the width $W_2$ must be made larger than 6.3 [µm]. As a consequence, the semiconductor device 10 shown in FIG. 1, which can satisfy the formula (20) and the formula (21), may become such a semiconductor device whose width $W_3$ is wide as compared with a conventional semiconductor device 90 shown in FIG. 14. This width $W_3$ is ½ of the minimum width of the second semiconductor layer 5 within the substrate plane, and is equivalent to the width of the IGBT cell 10$i$.

In the semiconductor device 10 shown in FIG. 1, the wider the width $W_2$ is increased, the easier the relationships of the formula 20 and the formula 21 are satisfied. In particular, it is desirable to set the width $W_2$ within a range larger than, or equal to 80 [µm] and smaller than, or equal to 500 [µm]. Since the width $W_2$ is limited only to such a wide range larger than, or equal to 80 [µm], mutual interference between the IGBT cell 10$i$ and the diode cell 10$d$ can be suppressed to low levels, so that the respective characteristics of the IGBT cell 10*i* and the diode cell 10*d* can be stabilized. Also, since the width $W_2$ is limited only to such a narrow range smaller than, or equal to 500 [μm], an inclination of current path of the diode cell 10*d* (in particular, a diode cell 10*d* in which first semiconductor region 8 illustrated in left and center portion of FIG. 1 is an anode region) in the substrate section is suppressed, so that the current path length becomes short. As a result, delays and losses occurred when the switching operation is performed in the diode cell 10*d* can be reduced.

As previously described, the semiconductor device 10 shown in FIG. 1 and capable of satisfying either the formula 20 or the formula 21 corresponds to such a compact semiconductor device manufactured by parallel-forming the FS type IGBT cell 10*i* having the low ON-voltage and the diode cell 10*d* in the single semiconductor substrate 4, and can be manufactured as the semiconductor device in which the occurrence of the snap back is suppressed. Also, the above-described method of designing the semiconductor device 10 may constitute the designing method capable of largely reducing the number of designing steps and the designing cost.

Next, a description is made of preferred shapes and preferred arrangements with respect to the second semiconductor layer 5 and the third semiconductor layer 6 within the substrate plane, provided on the rear plane side in the semiconductor device 10 of FIG. 1.

Figure 8A:
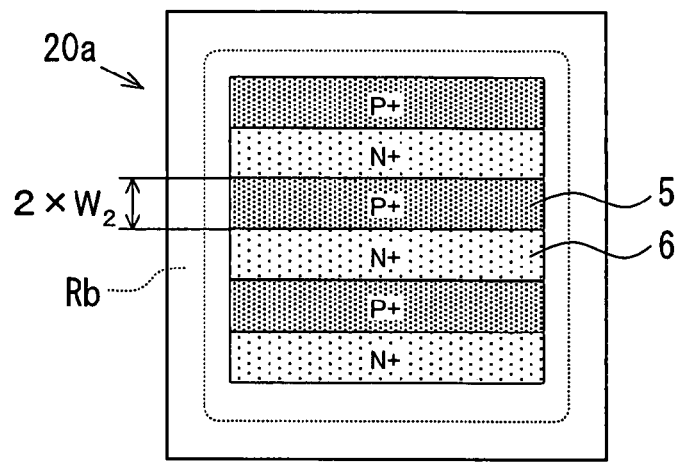
FIGS. 8A and 8B are lower plan views for schematically showing rear planes of chips 20$a$ and 20$b$ in which the semiconductor devices 10 of FIG. 1 have been formed.
Figure 8B:
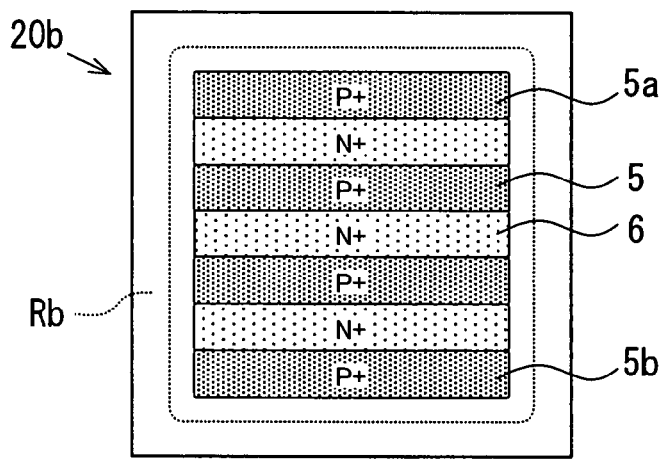

FIG. 8A and FIG. 8B are diagrams for showing an example as to the preferred shapes and the preferred arrangements of the second semiconductor layer 5 and the third semiconductor layer 6, namely lower plane views for schematically indicating rear plane sides of chips 20*a* and 20*b* (semiconductor substrate 4) where the semiconductor device 10 of FIG. 1 has been formed. Also, FIG. 8C is an upper plane view for schematically indicating major plane sides of the chips 20*a* and 20*b* indicated in FIG. 8A and FIG. 8B.

Figure 8C:
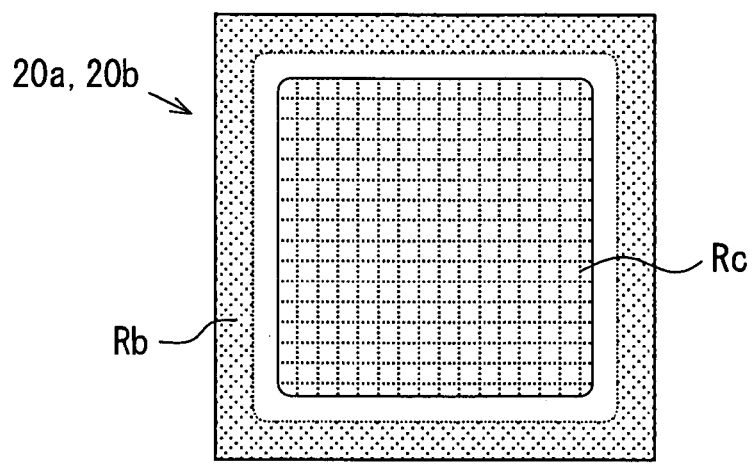
FIG. 8C is an upper plane view for schematically indicating a major plane of the chip 20$a$, or the chip 20$b$ shown in FIG. 8A and FIG. 8B.

As shown in FIG. 8C, generally speaking, a cell region "Rc" where the first semiconductor region 8 has been formed at center portions of the chips 20*a* and 20*b* on the major plane side of the semiconductor device 10 of FIG. 1 which is utilized under high voltage, for instance, in an on-vehicle inverter. The first semiconductor region 8 is commonly used by the IGBT cell 10*i* and the diode cell 10*d*. Also, a high voltage region "Rb" where a guard ring and the like have been formed is arranged at outer circumferential portions of the chips 20*a* and 20*b*.

As represent in FIG. 8A and FIG. 8B, on the rear plane sides of the chips 10*a* and 20*b*, both the second semiconductor layer 5 and the third semiconductor layer 6 have been arranged inside the high voltage region Rb which is arranged at an outer circumferential portion on the major plane side, which is indicated by a dot line. As a result, for example, as compared with such a case that the second semiconductor layer 5 is arranged at the center portion and the third semiconductor layer 6 is arranged just under the high voltage region Rb arranged at the outer circumferential portion of the major plane side, the inclination of the current path of the diode cell 10*d* on the substrate sectional plane is suppressed, so that the length of the current path can be shortened. This case is similar to the previously explained case where the width $W_2$ is limited to the narrow range smaller than, or equal to 500 [μm]. As a consequence, delays and losses occurred when switching operations are performed in the diode cell 10*d* can be reduced.

In the chips 20*a* and 20*b* shown in FIG. 8A and FIG. 8B, shapes of the second semiconductor layers 5 and the third semiconductor layers 6 within the substrate plane are so-called "paper strip" shapes. The second semiconductor layers 5 and the third semiconductor layers 6 are alternately arranged within the substrate plane. In this case, as shown in FIG. 8A, the double of $W_2$ in the semiconductor device 10 of FIG. 1 corresponds to the minimum width of the second semiconductor layers 5. Also, in the chip 20*b* shown in FIG. 8B, in particular, both ends of the region where the second semiconductor layers 5 and the third semiconductor layers 6 have been alternately arranged have been constituted by the second semiconductor layers 5*a* and 5*b*.

With respect to the shapes and the arrangement of the second semiconductor layers 5 and the third semiconductor layers 6, the second semiconductor layers 5 may be formed in a circular shape and arranged in an equi-interval within the substrate plane, and then, the third semiconductor layers 6 may be arranged in such a manner that these second semiconductor layers 5 are surrounded. However, since the second semiconductor layers 5 and the third semiconductor layers 6 are alternately arranged in the "paper strip" shape as shown in FIG. 8A and FIG. 8B, the arranging density of the first semiconductor region 8 can be increased which are commonly used by the IGBT cell 10*i* and the diode cell 10*d*, and the substrate can be utilized in a higher efficiency. Also, as indicated in FIG. 8B, both ends of the region where the second semiconductor layers 5 and the third semiconductor layers 6 have been alternately arranged are constituted by the second semiconductor layers 5*a* and 5*b*, so that delays and losses occurred when switching operations are performed in the diode cell 10*d* can be reduced. It should also be noted that in FIG. 8A and FIG. 8B, in order to readily understand the arranging relationship between the second semiconductor layers 5 and the third semiconductor layers 6, classifications of semiconductor layers at the outer circumferential portions of the chips 20*a* and 20*b* are not described. It is preferable that the outer circumferential portions of the chips 20*a* and 20*b* are formed as the second semiconductor layers 5, and the third semiconductor layers 6 having the "stripe paper" shapes are arranged within the second semiconductor layer 5 in the equi-interval.

Figure 9:
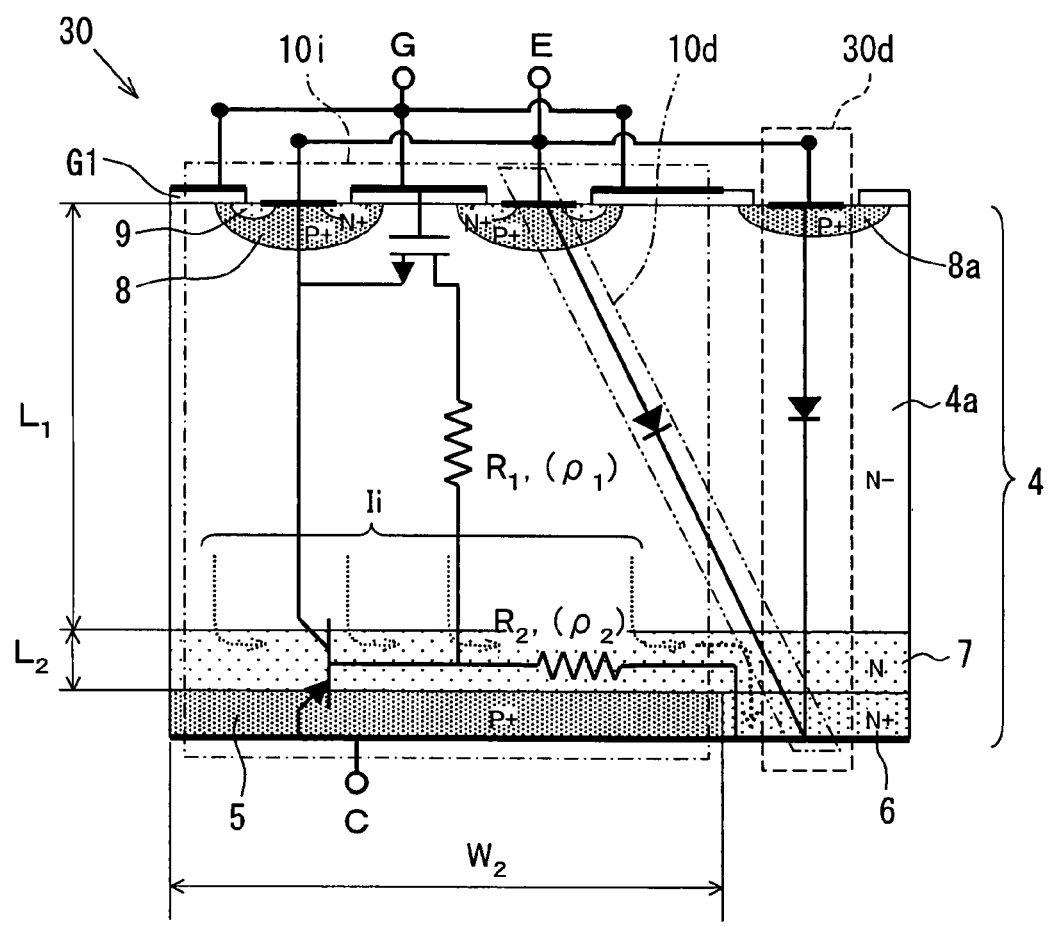
FIG. 9 is a sectional view for schematically indicating another semiconductor device 30, namely an example of the semiconductor device 30 according to the present invention.

FIG. 9 is an example of another semiconductor device 30 according to the present invention, namely a sectional view for schematically indicating the semiconductor device 30. It should be noted that the same reference numerals shown in the semiconductor device 10 of FIG. 1 will be employed as those for denoting similar element portions of the semiconductor device 30 of FIG. 9.

The diode cell 10*d* provided in the semiconductor device 10 of FIG. 1 has commonly used the first semiconductor region 8 as the anode region, and has been constituted only by a so-called "body diode cell." The first semiconductor region 8 corresponds to the channel forming region of the IGBT cell 10*i*. On the other hand, the semiconductor device 30 shown in FIG. 9 has an independent diode cell 30*d* in addition to the IGBT cell 10*i* and the body diode cell 10*d*. The independent diode cell 30*d* is surrounded by a broken line in this drawing, and is represented in the following description. That is to say, in the semiconductor device 30 of FIG. 9, a P conductivity type (P$^+$) third semiconductor region 8*a* has been formed in the surface layer-portion of the semiconductor substrate 4 on the major plane side thereof, which is separated from the first semiconductor region 8. Also, an electrode to be connected to the third semiconductor region 8*a* has been connected to a common electrode (E). The common electrode (E) is to be connected to both the first semiconductor region 8 and the second semiconductor region 9. As a consequence, the independent diode cell 30*d* has been formed by the third semiconductor region 8*a*, the first semiconductor layer 4*a*, the fourth semiconductor layer 7, and the third semiconductor layer 7.

In the semiconductor device 30 of FIG. 9, even when a current capacity cannot be secured only by the body diode cell 10*d* in relation to the IGBT cell 10*i*, since the independent diode cell 30*d* is parallel-formed, a shortage portion of the current capacity can be supplemented, so that a large current capacity can be secured. It should also be noted that the third semiconductor region 8*a* of the independent diode cell 30*d* can be formed at a position separated from the IGBT cell 10*d*, and impurity concentration may be properly set. As a result, it is possible to suppress deterioration of a recovery characteristic of the IGBT cell 10*i* in connection with forming of the independent diode cell.

It should also be noted that as to the semiconductor device 30 shown in FIG. 9, the structural parameters ($\rho_1, \rho_2, L_1, L_2, W_2$) are set in such a manner that either the formula (20) or the formula (21) can be satisfied. As a consequence, the semiconductor device 30 of FIG. 9 is also such a compact semiconductor device manufactured by parallel-forming the FS type IGBT cell 10*i* having the low ON-voltage and the diode cells 10*d* and 30*d* in the single semiconductor substrate 4, and can be manufactured as the semiconductor device in which the occurrence of the snap back is suppressed.

Next, a description is made of preferred shapes and preferred arrangements within the substrate plane with respect to the second semiconductor layer 5 and the third semiconductor layer 6 formed on the rear plane side, and the first semiconductor region 8 and the third semiconductor region 8*a* formed on the major plane side in the semiconductor device 30 of FIG. 9.

Figure 10A:
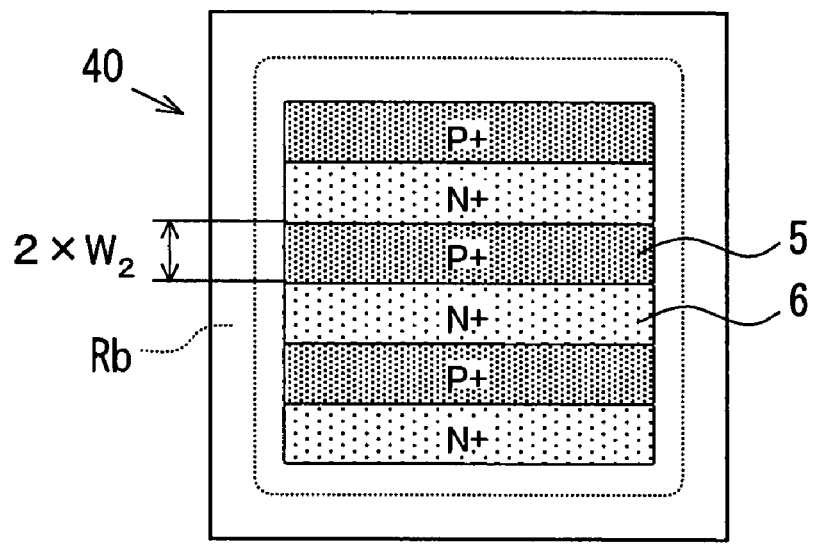
FIG. 10A is a lower plane view for indicating an example as to preferred shapes and preferred arrangements of a second semiconductor layer 5 and a third semiconductor layer 6 provided on a rear plane of a chip 40 where the semiconductor device 30 of FIG. 9 has been formed.
Figure 10B:
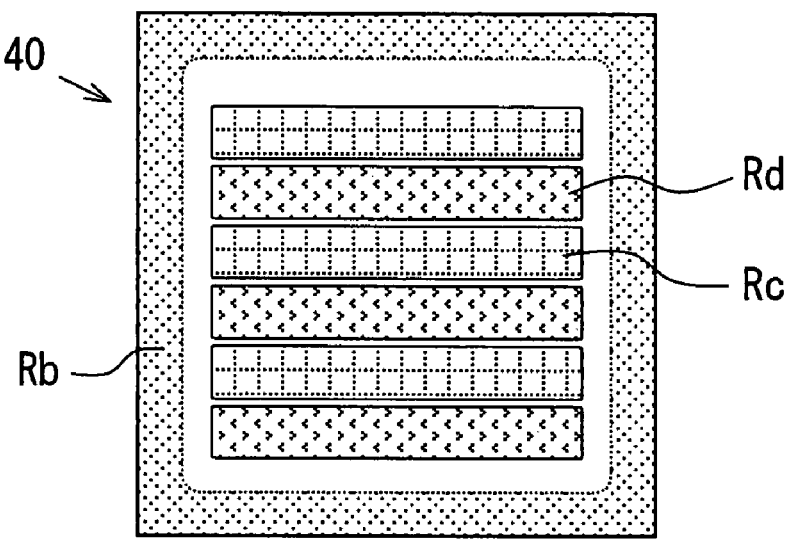
FIG. 10B is an upper plane view for indicating an example as to preferred shapes and preferred arrangements of a first semiconductor region 8 and a third semiconductor region 8a provided on a major plane thereof.

FIG. 10A and FIG. 10B are diagrams for schematically indicating a chip 40 (semiconductor substrate 4) where the semiconductor device 30 of FIG. 9 has been formed. FIG. 10A is a lower plane view for representing an example as to the preferred shapes and the preferred arrangement of the second semiconductor layer 5 and the third semiconductor layer 6 formed on the rear plane side. FIG. 10B is an upper plane view for representing an example as to the preferred shapes and the preferred arrangement of the first semiconductor layer 8 and the third semiconductor layer 8*a* formed on the major plane side. It should be noted that in the chips 40 shown in FIG. 10A and FIG. 10B, same reference numerals shown in the chips 20*a* and 20*b* of FIG. 8 will be employed as those for denoting the same, or similar portions.

As indicated in FIG. 10A, both the shapes and the arrangement of the second semiconductor layer 5 and the third semiconductor layer 6 formed on the rear plane side of the chip 40 are identical to both the shapes and the arrangement of the second semiconductor layer 5 and the third semiconductor layer 6 formed on the rear plane side of the chip 20*a* shown in FIG. 8A. On the other hand, as indicated in FIG. 10B, a cell region "Rc" where the first semiconductor region 8 has been formed is a "strip paper" shape (first semiconductor regions 8 having strip paper shapes have been arranged in parallel). The first semiconductor region 8 is commonly used by the IGBT cell 10*i* and the diode cell 10*d* on the major plane side of the chip 40. Also, an independent diode cell region "Rd" having the same "strip paper" shape (third semiconductor regions 8*a* having strip paper shapes have been arranged in parallel) have been alternately arranged with respect to the cell region "Rc" having the strip paper shape. In the chips 40 shown in FIG. 10A and FIG. 10B, the cell region Rc constructed of the first semiconductor regions 8 has been arranged just above the second semiconductor layer 2, and the independent diode cell region Rd constructed of the third semiconductor region 8*a* has been arranged just above the third semiconductor layer 6. As a result, with respect to the independent diode cell 30*d* provided in the independent diode cell region Rd, delays and losses occurred during the switching operations can be reduced. It should also be noted that in FIG. 10A and FIG. 10B, both the second semiconductor layers 5 (cell region Rc) and the third semiconductor layers 6 (independent diode cell region Rd) are made in the strip paper shapes having the substantially same widths. Alternatively, each of the widths as to the second semiconductor layers 5 (cell region Rc) and the third semiconductor layers 6 (independent diode cell region Rd) may be properly set in accordance with characteristic required for the IGBT cell 10*i*, the diode cell 10*d*, and the independent diode cell 30*d*. It should also be noted that similarly in FIG. 10A, in order to readily understand the arranging relationship between the second semiconductor layers 5 and the third semiconductor layers 6, classifications of semiconductor layers at the outer circumferential portions of the chip 40 are not described. It is preferable that the outer circumferential portion of the chip 40 is formed as the second semiconductor layers 5 and the third semiconductor layers 6 having the "stripe paper" shapes are arranged within the second semiconductor layer 5 in the equi-interval.

Figure 11:
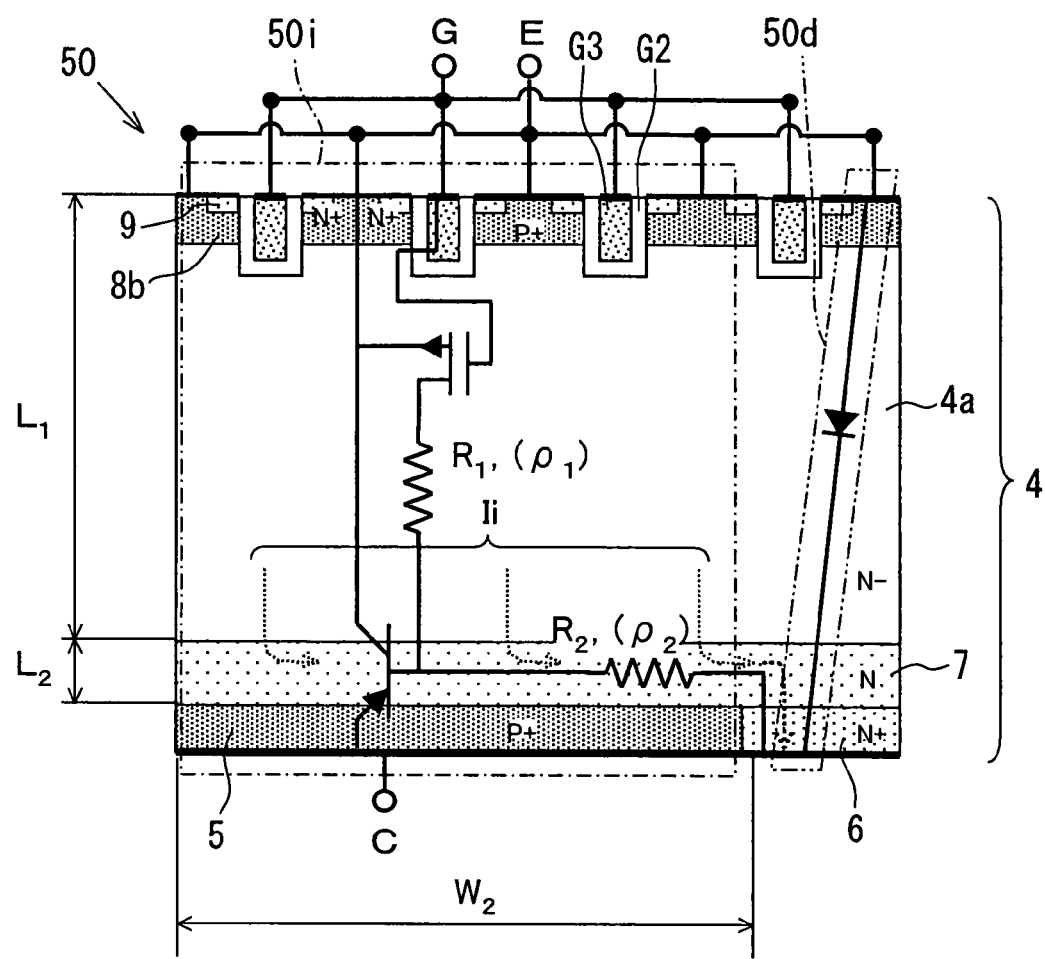
FIG. 11 is a sectional view for schematically showing a semiconductor device 50, namely, an example of another semiconductor device.
Figure 12:
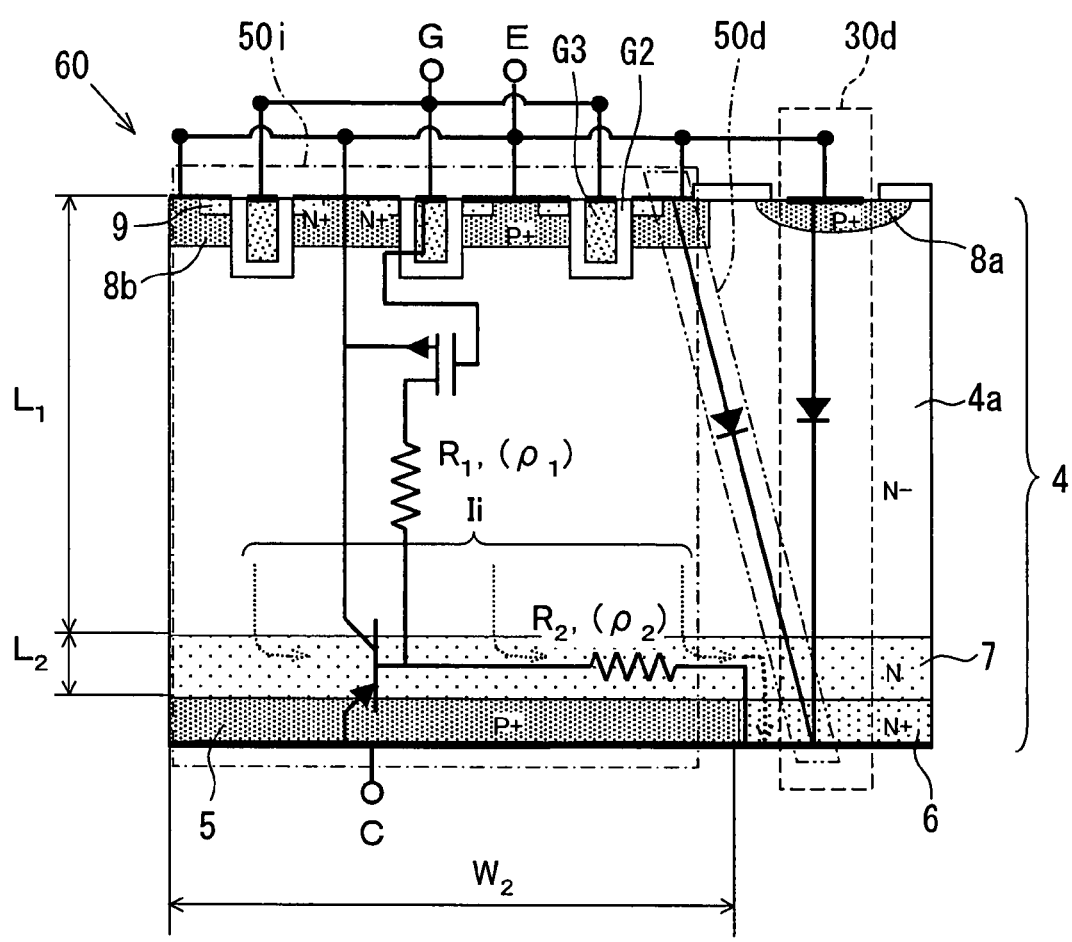
FIG. 12 is a sectional view for schematically showing a semiconductor device 60, namely, an example of another semiconductor device.

FIG. 11 and FIG. 12 are examples of other semiconductor devices 50 and 60 according to the present invention, namely sectional views for schematically indicating the semiconductor devices 50 and 60. It should be noted that the same reference numerals shown in the semiconductor devices 10 and 30 of FIG. 1 and FIG. 9 will be employed as those for denoting similar element portions of the semiconductor devices 50 and 60 of FIG. 11 and FIG. 12.

In any one of the semiconductor devices 10 and 30 of FIG. 1 and FIG. 9, the IGBT cell 10*i* having the gate electrode (G) of the plane structure has been formed. In contrast, in the semiconductor devices 50 and 60 shown in FIG. 11 and FIG. 12, an IGBT cell 50*i* having a gate electrode (G) of a trench structure has been formed, while the gate electrode (G) is made of a side wall oxide film G2 and embedded poly crystalline silicon G3. In the semiconductor devices 50 and 60, while a continued first semiconductor region 8*a* has been formed in the surface layer portion of the semiconductor substrate 4 on the major plane side, both an IGBT cell 50*i* and a body diode cell 50*d* have been constructed by commonly using the first semiconductor region 8*a*. It should be noted that the semiconductor device 50 of FIG. 11 has been constructed by employing only the IGBT cell 50*i* and the body diode cell 50*d*. On the other hand, in the semiconductor device 60 of FIG. 12, an independent diode cell 30*d* has been additionally formed.

It should also be noted that as to the semiconductor devices 50 and 60 shown in FIG. 11 and FIG. 12, the structural parameters ($\rho_1, \rho_2, L_1, L_2, W_2$) are set in such a manner that either the formula (20) or the formula (21) can be satisfied. As a consequence, the semiconductor devices 50 and 60 of FIG. 11 and FIG. 12 are also such compact semiconductor devices manufactured by parallel-forming the FS type IGBT cell 50*i* having the low ON-voltage and the diode cells 50*d*, 30*d* in the single semiconductor substrate 4, and can be manufactured as the semiconductor device in which the occurrence of the snap back is suppressed.

It should also be noted that the semiconductor device 10 shown in FIG. 1 corresponds to such a semiconductor device that the collector layer 5 of the P conductivity type IGBT cell 10*i* and the N conductivity type cathode electrode connection layer 6 of the diode cell 10*d* have been formed on the rear plane side of the N conductivity type semiconductor substrate 4. In order to achieve a better characteristic as to an IGBT corresponding to structural elements of a semiconductor device, the conductivity type structures of the respective portions of the semiconductor device 10 shown in FIG. 1 are desirable. However, the present invention is not limited only to these conductivity type structures, but may be realized by employing such a semiconductor device that all of the conductivity types of the respective regions in the semiconductor device 10 have been reversed. That is to say, as apparent from the foregoing description, the above-described effects as to the semiconductor device 10 may be similarly applied also to such a semiconductor device that a collector layer of an N conductivity type IGBT cell and a P conductivity type anode electrode connection layer of a diode cell have been formed on the rear plane side of a P conductivity type semiconductor substrate. As a consequence, even such a semiconductor device that all of the conductivity types of the respective regions in the semiconductor device 10 have been reversed may correspond to a compact semiconductor device manufactured by parallel-forming an FS type IGBT cell having a low ON-voltage and a diode cell in a single semiconductor substrate, and can be manufactured as the semiconductor device in which the occurrence of the snap back is suppressed.

Figure 13:
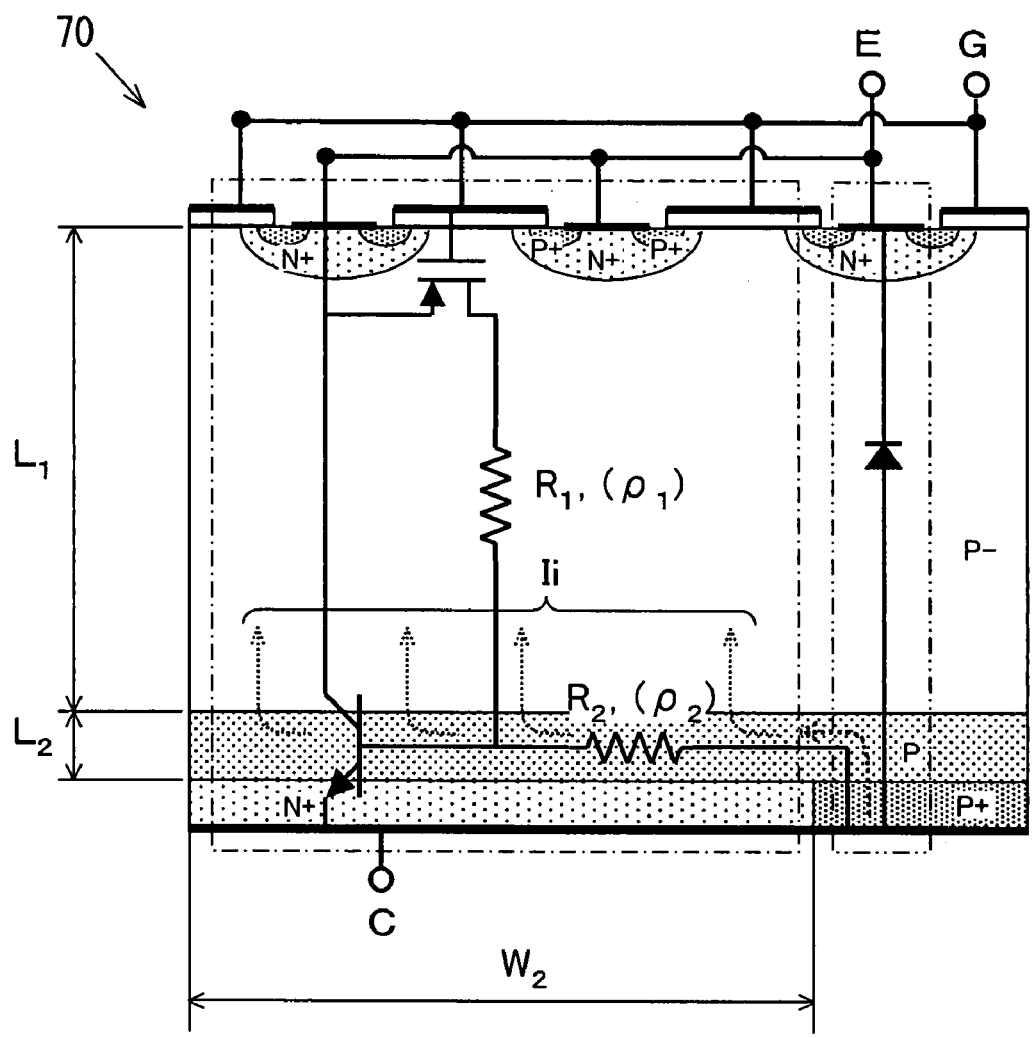
FIG. 13 is a diagram for indicating a semiconductor device 70 in which all of conductivity types of the respective regions in the semiconductor device 10 of FIG. 1 have been reversed.

FIG. 13 indicates a semiconductor device 70 in which all of the conductivity types of the respective regions in the semiconductor device 10 of FIG. 1 have been inverted.

Any of the above-described semiconductor devices corresponds to such a compact semiconductor device manufactured by parallel-forming an IGBT cell, a diode cell, and an independent diode cell in a single semiconductor device. As a consequence, the above-described semiconductor device may be suitably realized as such a semiconductor device which is employed in an inverter circuit arranged by combining an IGBT with a free wheel diode (FWD), and a diode made by the above-described diode cell and an independent diode cell is employed as the above-described FWD.

Also, the above-described semiconductor device corresponds to a compact semiconductor device capable of suppressing the snap back voltage $V_{SB}$ even under the above-described severe use environment, and also, capable of securing a high withstanding voltage. As a consequence, the above-described semiconductor device is suitably used as an on-vehicle semiconductor device.

The above-disclosed inventive ideas of the present invention cover the below-mentioned various modification modes.

In accordance with a first modification mode of the present disclosed ideas, a semiconductor device is constituted by a semiconductor substrate, an IGBT cell arranged in the semiconductor substrate, and a diode cell arranged in the semiconductor substrate. The semiconductor device has a first conductivity type first semiconductor layer, a second conductivity type second semiconductor layer, a first conductivity type third semiconductor layer, and a first conductivity type fourth semiconductor layer. The first semiconductor layer is arranged on a first plane of the semiconductor substrate. The second semiconductor layer and the third semiconductor layer are arranged on a second plane of the semiconductor substrate in such a manner that the second semiconductor layer is located adjacent to the third semiconductor layer. The fourth semiconductor layer is sandwiched between the first semiconductor layer and the second and third semiconductor layers. The first semiconductor layer provides a drift layer of a carrier of the IGBT cell and the diode cell. The second semiconductor layer provides a collector layer of the IGBT cell. The third semiconductor layer provides one electrode connection layer of the diode cell. A resistivity of the first semiconductor layer is defined as $\rho_1$ [$\Omega\cdot$m], and a thickness of the first semiconductor layer is defined as $L_1$ [μm]. A resistivity of the fourth semiconductor layer is defined as $\rho_2$ [$\Omega\cdot$cm], and a thickness of the fourth semiconductor layer is defined as $L_2$ [μm]. ½ of a minimum width of the second semiconductor layer within a plane located parallel to the semiconductor substrate is defined as $W_2$ [μm]. A relationship of $(\rho_1/\rho_2)\times(L_1\cdot L_2/W_2^2)<1.6$ can be satisfied.

In the above-described semiconductor device, the IGBT cell and the diode cell have been parallel-formed in one semiconductor substrate. Also, in the IGBT cell, the fourth semiconductor layer corresponding to the field stop (FS) layer has been formed between the first semiconductor layer (body layer) corresponding to the drift layer of the carrier, and the second semiconductor layer corresponding to the collector layer. As a consequence, the above-described semiconductor device constitutes a compact semiconductor device manufactured by parallel-forming an FS type IGBT having a low ON-voltage and a diode cell in a single semiconductor substrate.

In the above-described semiconductor device, the parameters $\rho_1$, $L_1$, $\rho_2$, $L_2$, and $W_2$ have been set based upon a simulation result in such a manner that the parameters can satisfy the formula $(\rho_1/\rho_2)\times(L_1\cdot L_2/W_2^2)<1.6$. As a result, in the above-described semiconductor device, the snap back voltage $V_{SB}$ occurred in the IGBT cell can be decreased lower than the threshold voltage $V_{CE(th)}\cong 0.8$ V at the temperature of −40° C., while this threshold voltage is a maximum value under normal use environment.

As previously described, while the above-described semiconductor device constitutes such a compact semiconductor device manufactured by parallel-forming the FS type IGBT having the low ON-voltage and the diode cell in the single semiconductor substrate, this semiconductor device may be arranged by which the occurrence of the snap back is suppressed.

Alternatively, as an alternative idea, a relationship of $(\rho_1/\rho_2)\times(L_1\cdot L_2/W_2^2)<0.4$ may be satisfied.

As a result, the snap back voltage $V_{SB}$ occurred in the IGBT cell can be suppressed to be a substantially negligible value (namely, lower than 0.1 V) with respect to the threshold voltage $V_{CE(th)}=0.8$ V at the temperature of −40° C., while this threshold voltage is a maximum value under normal use environment.

In the above-described semiconductor device, the parameters $\rho_1$ and $L_1$ give a large influence to a withstanding voltage of the IGBT cell, whereas the parameters $\rho_2$ and $L_2$ give a large influence to a switching characteristic of the IGBT cell. As a consequence, as an alternative idea, such a parameter relationship of $\rho_1>20$, $\rho_2<1.0$, $L_1>40$, $L_2>0.5$ may be employed. In this alternative case, the width $W_2$ of the semiconductor becomes larger than 32 [μm]. As a result, a necessary switching characteristic may be secured, and the withstanding voltage of the semiconductor device may be realized higher than, or equal to 600 V, and for example, in an automobile-purpose inverter, the standard withstanding voltage of 600 V can be secured which is generally required in this inverter.

Alternatively, as an alternative idea, such a parameter relationship of $\rho_1>40$, $\rho_2<1.0$, $L_1>80$, $L_2>0.5$ may be employed. In this case, the withstanding voltage of the above-described semiconductor device may be increased higher than, or equal to 1200V. It is especially possible to secure the standard withstanding voltage of 1200 V which is required for an on-vehicle inverter having a high withstanding voltage, Also, the width $W_2$ of the semiconductor device becomes wider than 63 [μm].

Alternatively, as an alternative idea, $L_2>5.0$ may be employed. In this alternative case, since $L_2$ is large, $\rho_2$ can be set to be high. As a result, the withstanding voltage of the semiconductor device with respective to a surge voltage can be increased.

Alternatively, as an alternative idea, such a relationship of $80 \leqq W_2 \leqq 500$ may be employed. Since the width $W_2$ is limited only to such a wide range larger than, or equal to 80 [μm], mutual interference between the IGBT cell and the diode cell can be suppressed to low levels, so that the respective characteristics of the IGBT cell and the diode cell can be stabilized. Also, since the width $W_2$ is limited only to such a narrow range smaller than, or equal to 500 [μm], an inclination of current path of the diode cell in the substrate sectional view is suppressed, so that the current path length becomes short. As a result, delays and losses occurred when the switching operation is performed in the diode cell 10d can be reduced.

Alternatively, as an alternative case, a semiconductor substrate may have a high voltage region arranged on a first plane. The high voltage region is grounded on an outer circumferential portion of the semiconductor substrate, and the third semiconductor layer is arranged inside the high voltage region. Also, as a consequence, as compared with such a case that the third semiconductor layer is arranged just Under the high voltage region arranged on the outer circumferential portion on the major plane side, an inclination of a current path of a diode cell in the substrate sectional plane is suppressed, so that a length of the current path is shortened. As a consequence, delays and losses occurred when switching operations are performed in the diode cell may be reduced.

Alternatively, as an alternative idea, each of the second semiconductor layer and the third semiconductor layer may have a "strip paper" shape within a plane located parallel to the semiconductor substrate. The second semiconductor layer and the third semiconductor layer have been alternately arranged within the plane parallel to the semiconductor substrate. Furthermore, the second semiconductor layers may be arranged on both ends within the plane parallel to the semiconductor substrate. As to the shapes and the arrangement of the second semiconductor layers and the third semiconductor layers, the second semiconductor layers may be formed as a circular shape, and may be arranged in an equi-interval within the substrate plane, and the third semiconductor layer may be arranged so as to surround these second semiconductor layers. However, since the second semiconductor layers and the third semiconductor layers are formed as the "strip paper" shapes and are alternately arranged in the above-described manner, the arranging density of the IGBT cells and the diode cells may be increased, and thus, the substrate may be utilized in a higher efficiency. Also, since both ends of the region made by alternately arranging the second semiconductor layers and the third semiconductor layers are constituted by the second semiconductor layer, delays and losses occurred when the switching operations are performed in the diode cells may be reduced.

Alternatively, as an alternative idea, a semiconductor substrate may further have a common electrode, a second conductivity type first semiconductor region, and a first conductivity type second semiconductivity region. The first semiconductor region is arranged within a surface layer portion of a first plane of a semiconductor substrate. The second semiconductor region is arranged within the first semiconductor region. The common electrode is commonly connected to both the first semiconductor region and the second semiconductor region. The common electrode provides an emitter electrode of an IGBT cell and another electrode of a diode cell. In this case, the diode cell employed in the semiconductor device is arranged by the first semiconductor region, the first semiconductor layer, the fourth semiconductor layer, and the third semiconductor layer, while the diode cell is so-called as a "body diode cell" which commonly uses the first semiconductor region corresponding to a channel forming region of the IGBT cell.

Alternatively, as an alternative idea, the semiconductor substrate may have a second conductivity type third semiconductor region. The third semiconductor region is arranged in the surface layer portion of the first plane of the semiconductor substrate. The third semiconductor region is separated from the first semiconductor region. The common electrode is connected to the third semiconductor region. The third semiconductor region, the first semiconductor region, the fourth semiconductor layer, and the third semiconductor layer provide an independent diode cell. As a consequence, even when a current capacity cannot be secured only by the body diode cell in relation to the IGBT cell, since the independent diode cell is parallel-formed, a shortage portion of the current capacity can be supplemented, so that a large current capacity can be secured. It should also be noted that the third semiconductor region of the independent diode cell can be formed at a position which is separated from the IGBT cell, and impurity concentration may be properly set. As a result, it is possible to suppress deterioration of a recovery characteristic of the IGBT cell in connection with forming of the independent diode cell.

Alternatively, as an alternative idea, a semiconductor substrate may further have a common electrode, a second conductivity type first semiconductor region, a first conductivity type second semiconductivity region, and a second conductivity type third semiconductor region. The first semiconductor region is arranged within a surface layer portion of a first plane of a semiconductor substrate. The second semiconductor region is arranged within the first semiconductor region. The common electrode is commonly connected to both the first semiconductor region and the second semiconductor region. The common electrode provides an emitter electrode of an IGBT cell and another electrode of a diode cell. The third semiconductor region is arranged in the surface layer portion of the first main plane of the semiconductor substrate. The third semiconductor region is separated from the first semiconductor region. The common electrode is connected to the third semiconductor region. The third semiconductor region, the first semiconductor region, the fourth semiconductor layer, and the third semiconductor layer provide an independent diode cell. Each of the first semiconductor region and the third semiconductor region has a "strip paper" shape within a plane located parallel to the semiconductor substrate. The first semiconductor region and the third semiconductor region have been alternately arranged within the plane parallel to the semiconductor substrate. Furthermore, the first semiconductor region may be arranged on an upper portion of the second semiconductor substrate, and the third semiconductor region may be arranged on an upper portion of the third semiconductor layer. In this case, the following arrangement is preferable. That is, the first semiconductor region is arranged just above the second semiconductor layer within the substrate plane, whereas the third semiconductor region is arranged just above the third semiconductor layer within the substrate plane. As a result, delays and losses occurred when the switching operations are carried out in the independent diode cell may be reduced.

Alternatively, as an alternative idea, the semiconductor device may be employed in an inverter circuit. Both the diode cell and the independent diode cell may provide a free wheel diode.

Alternatively, as an alternative idea, the semiconductor device may be employed as an on-vehicle semiconductor device. In this case, the above-described semiconductor device corresponds to a compact semiconductor device capable of suppressing the snap back voltage $V_{SB}$ even under the above-described severe use environment, and also, capable of securing a high withstanding voltage.

In a second modification mode of the present disclosed ideas, a method for designing a semiconductor device may be provided. A resistivity of the first semiconductor layer is defined as $\rho_1$ [Ω·cm], and a thickness of the first semiconductor layer is defined as $L_1$ [μm]. A resistivity of the fourth semiconductor layer is defined as $\rho_2$ [Ω·cm], and a thickness of the fourth semiconductor layer is defined as $L_2$ [μm]. ½ of a minimum width of the second semiconductor layer within a plane located parallel to the semiconductor substrate is defined as $W_2$ [μm]. In order to satisfy such a relationship of $(\rho_1/\rho_2) \times (L_1 \cdot L_2/W_2^2) < K$, this designing method is constituted by steps for designing the first semiconductor layer, the second semiconductor layer, and the fourth semiconductor layer. Symbol "K" indicates a predetermined constant.

Symbol "K" of the right hand of the formula in the above-described designing method may be handled as a constant with respect to the allowable snap back voltage $V_{SB}$. This value of "K" may be previously determined by simulating snap back voltages $V_{SB}$ of several pieces of models having different parameters of $(\rho_1, L_1, \rho_2, L_2, W_2)$.

Also, in accordance with the above-described method, it is possible to provide a compact semiconductor device manufactured by parallel-forming an FS type IGBT cell having a low ON-voltage and a diode cell in a single semiconductor device.

Also, the snap back voltage $V_{SB}$ occurred in the IGBT cell can be decreased lower than the threshold voltage $V_{CE(th)}=0.8$ V at the temperature of −40° C., while this threshold voltage is a maximum value under normal use environment.

As previously described, in accordance with the above-described method, it is possible to provide such a compact semiconductor device manufactured by parallel-forming the FS type IGBT having the low ON-voltage and the diode cell in the single semiconductor substrate, while this semiconductor device may be arranged by which the occurrence of the snap back is suppressed.

Alternatively, as an alternative idea, the value "K" may be set as 1.6. In this alternative case, the allowable snap back voltage $V_{SB}$ becomes lower than, or equal to 0.8V.

Alternatively, as an alternative idea, the value "K" may be set as 0.4. In this alternative case, the allowable snap back voltage $V_{SB}$ may be substantially neglected (namely, lower than 0.1 V).

As previously explained, if the value "K" is once determined, while the arbitrary semiconductor devices having the different structural parameters $(\rho_1, L_1, \rho_2, L_2, W_2)$ are not simulated, such a semiconductor device whose snap back voltage is lower than, or equal to the allowable snap back voltage $V_{SB}$ can be designed. As a consequence, the number of designing steps and the designing cost can be largely reduced.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

The invention claimed is:

1. A semiconductor device comprising:
a semiconductor substrate;
an IGBT cell arranged in the semiconductor substrate; and
a diode cell arranged in the semiconductor substrate, wherein
the semiconductor substrate includes a first semiconductor layer having a first conductive type, a second semiconductor layer having a second conductive type, a third semiconductor layer having the first conductive type and a fourth semiconductor layer having the first conductive type,
the first semiconductor layer defines a first surface of the semiconductor substrate,
the second semiconductor layer and the third semiconductor layer define a second surface of the semiconductor substrate, and are adjacent to each other,
the fourth semiconductor layer is sandwiched between the first semiconductor layer and the second and third semiconductor layers,
the first semiconductor layer provides a drift layer of a carrier for the IGBT cell and the diode cell,
the second semiconductor layer provides a collector layer of the IGBT cell,
the third semiconductor layer provides one of electrode connection layers of the diode cell,
a resistivity of the first semiconductor layer is defined as $\rho_1$ [Ω·cm], and a thickness of the first semiconductor layer is defined as $L_1$ [μm],
a resistivity of the fourth semiconductor layer is defined as $\rho_2$ [Ω·cm], and a thickness of the fourth semiconductor layer is defined as $L_1$ [μm],
a half of a minimum width of the second semiconductor layer on a plane parallel to the second surface of the semiconductor substrate is defined as $W_2$ [μm], a relationship of $0<(\rho_1/\rho_2) \times (L_1 \cdot L_2/W_2^2)<1.6$ is satisfied, the semiconductor substrate further includes a high voltage region arranged on an outer circumferential region of the semiconductor substrate, and the third semiconductor layer is arranged inside of the high voltage region, wherein the third semiconductor layer having a doping concentration higher than that of the fourth semiconductor layer.

2. The semiconductor device according to claim 1, wherein a relationship of $0<(\rho_1/\rho_2) \times (L_1 \cdot L_2/W_2^2)<0.4$ is satisfied.

3. The semiconductor device according to claim 1, wherein
$\rho_1 > 20$ Ωcm,
$0$ Ωcm $<\rho_2<1.0$ Ωcm,
$L_1>40$ μm, and
$L_2>0.5$ μm.

4. The semiconductor device according to claim 3, wherein
$\rho_1 > 40$ Ωcm,
$0$ Ωcm $<\rho_2<1.0$ Ωcm,
$L_1>80$ μm, and
$L_2>0.5$ μm.

5. The semiconductor device according to claim 3, wherein $L_2>5.0$ μm.

6. The semiconductor device according to claim 1, wherein $80$ μm $\leq W_2 \leq 500$ μm.

7. The semiconductor device according to claim 1, wherein
each of the second semiconductor layer and the third semiconductor layer has a stripe shape on the plane parallel to the semiconductor substrate, and
the second semiconductor layer and the third semiconductor layer are alternately arranged on the plane parallel to the semiconductor substrate.

8. The semiconductor device according to claim 7, wherein the second semiconductor layer is arranged on both ends of the second surface of the semiconductor substrate.

9. The semiconductor device according to claim 7, wherein
the semiconductor substrate further includes a first semiconductor region having the second conductive type, a second semiconductor region having the first conductive type, a common electrode and a third semiconductor region having the second conductive type,
the first semiconductor region is arranged in a surface portion of the first surface of the semiconductor substrate,
the second semiconductor region is arranged in the first semiconductor region,
the common electrode is commonly coupled with the first semiconductor region and the second semiconductor region,
the common electrode provides an emitter electrode of the IGBT cell and the other one of electrodes of the diode cell,
the third semiconductor region is arranged in a surface portion of the first surface of the semiconductor substrate,
the third semiconductor region is separated from the first semiconductor region,
the common electrode is coupled with the third semiconductor region,
the third semiconductor region, the first semiconductor layer, the fourth semiconductor layer and the third semiconductor layer provide an independent diode cell,
each of the first semiconductor region and the third semiconductor region has a stripe shape on the plane parallel to the semiconductor substrate, and
the first semiconductor region and the third semiconductor region are alternately arranged on the plane parallel to the semiconductor substrate.

10. The semiconductor device according to claim 9, wherein
the first semiconductor region is arranged above the second semiconductor layer, and
the third semiconductor region is arranged above the third semiconductor layer.

11. The semiconductor device according to claim 1, wherein
the semiconductor substrate further includes a common electrode, a first semiconductor region having the second conductive type and a second semiconductor region having the first conductive type,
the first semiconductor region is arranged in a surface portion of the first surface of the semiconductor substrate,
the second semiconductor region is arranged in the first semiconductor region,
the common electrode is commonly coupled with the first semiconductor region and the second semiconductor region, and
the common electrode provides the other one of electrodes of the diode cell and an emitter electrode of the IGBT cell.

12. The semiconductor device according to claim 11, wherein
the semiconductor substrate further includes a third semiconductor region having the second conductive type,
the third semiconductor region is arranged in a surface portion of the first surface of the semiconductor substrate,
the third semiconductor region is separated from the first semiconductor region,
the common electrode is coupled with the third semiconductor region, and
the third semiconductor region, the first semiconductor layer, the fourth semiconductor layer and the third semiconductor layer provide an independent diode cell.

13. The semiconductor device according to claim 1, wherein
the first conductive type is a N conductive type, and
the second conductive type is a P conductive type.

14. The semiconductor device according to claim 1, wherein
the semiconductor device is used for an inverter circuit, and
the diode cell and an independent diode cell provide a free wheel diode.

15. The semiconductor device according to claim 1, wherein
the semiconductor device is an in-vehicle semiconductor device.

* * * * *